US007203149B1

(12) United States Patent
Sano

(10) Patent No.: US 7,203,149 B1
(45) Date of Patent: Apr. 10, 2007

(54) PLL CIRCUIT AND DATA READ-OUT CIRCUIT

(75) Inventor: Masaki Sano, Tokyo (JP)

(73) Assignee: NEC Electronics Corporation (JP)

( * ) Notice: Subject to any disclaimer, the term of this patent is extended or adjusted under 35 U.S.C. 154(b) by 1338 days.

(21) Appl. No.: 09/712,104

(22) Filed: Nov. 14, 2000

(30) Foreign Application Priority Data

Nov. 15, 1999 (JP) ................................. 11-324576

(51) Int. Cl.
*G11B 7/45* (2006.01)
*H03L 7/06* (2006.01)

(52) U.S. Cl. ............................... 369/59.11; 369/59.15; 369/59.17; 369/124.11; 331/11; 331/14

(58) Field of Classification Search ............ 369/59.11, 369/59.15, 59.17, 47.32, 124.11; 331/6, 331/8, 17, 25, 11, 14, 16; 360/51; 348/731
See application file for complete search history.

(56) References Cited

U.S. PATENT DOCUMENTS 4,918,404 A * 4/1990 Vitiello et al. ................ 331/11
5,574,515 A * 11/1996 Ogasawara .................. 348/731

FOREIGN PATENT DOCUMENTS

| JP | 58-009409 | 1/1983 |
| JP | 59-172180 | 9/1984 |
| JP | 6-152401 | 5/1994 |
| JP | 11-186904 | 7/1999 |
| JP | 11-298261 | 10/1999 |
| JP | 2000-22526 | 1/2000 |
| JP | 2001-135038 | 5/2000 |
| JP | 2000-224027 | 8/2000 |
| JP | 2000-332602 | 11/2000 |

* cited by examiner

*Primary Examiner*—Andrea Wellington
*Assistant Examiner*—Kim-Kwok Chu
(74) *Attorney, Agent, or Firm*—Hayes Soloway P.C.

(57) ABSTRACT

Disclosed is a PLL circuit having a voltage-controlled oscillator, to which a difference voltage across non-inverting and inverting input terminals is input as a control voltage, for oscillating at a frequency in accordance with the control voltage; a phase comparator for comparing the phase of an output signal obtained by frequency-dividing the output of the voltage-controlled oscillator by a frequency-divider, with the phase of an input signal and outputting the result of this phase comparison; first and second loop filters connected at output terminals thereof to the non-inverting and inverting input terminals, respectively, of the voltage-controlled oscillator; and a charge pump, which is responsive to receipt of an UP signal supplied from the phase comparator, for supplying a first charging current from a PMOS transistor to a capacitor of the first loop filter and supplying a first discharge current from an NMOS transistor to a capacitor of the second loop filter, and which is responsive to receipt of a DOWN signal supplied from the phase comparator, for supplying a second charging current from a PMOS transistor to a capacitor of the second loop filter and supplying a second discharge current from an NMOS transistor to a capacitor of the first loop filter.

21 Claims, 13 Drawing Sheets

$V_O = V_A + (\Delta V_{up+} + \Delta V_{up-})$ $V_O = V_B - (\Delta V_{DOWN-} + \Delta V_{DOWN+})$

FIG. 6

| EXAMPLE | SPECIFIC EXAMPLE | UP:DN | DECISION |
|---|---|---|---|
| 1 | PRIOR ART: P = 10 µA, N = 10 µA | 1:1 | NO PROBLEM |
| 2 | PRIOR ART: P = 12 µA, N = 10 µA | 1.2:1 | PROBLEM |
| 3 | PRESENT INVENTION: P1 = P2 = 10 µA, N1 = N2 = 10 µA | 1:1 | NO PROBLEM |
| 4 | PRESENT INVENTION: P1 = P2 = 12 µA, N1 = N2 = 10 µA | 1:1 | NO PROBLEM |

US 7,203,149 B1

PLL CIRCUIT AND DATA READ-OUT CIRCUIT

FIELD OF THE INVENTION

This invention relates to a PLL (Phase-Locked Loop) circuit and, more particularly, to a PLL circuit having a charge pump for converting the result of phase comparison by a phase comparator to a voltage in precise fashion, and to a data read-out circuit having this PLL circuit.

BACKGROUND OF THE INVENTION

PLL circuits find use in a variety of applications such as in the demodulation of frequency- and phase-modulated signals, frequency conversion, carrier regeneration and signal synchronization such as clock synchronization and timing extraction. An example of a PLL circuit according to the prior art will be described below.

FIG. 10 is a block diagram illustrating an example of the structure of a conventional PLL circuit. As shown in FIG. 10, the PLL circuit includes a voltage-controlled oscillator (VCO) 40' which oscillates at a frequency conforming to a control voltage applied thereto; a frequency divider 50 for frequency-dividing the output signal of the voltage-controlled oscillator 40'; a phase comparator 10, to which an input signal IN and an output signal OUT from the frequency divider 50 are input, for comparing the phases of these input signals and outputting an UP signal and a DOWN signal having pulse widths that correspond to the result of the phase comparison; a charge pump (CP) 20', which charges and discharges a capacitor in accordance with the UP and DOWN signals output from the phase comparator 10, for generating a voltage conforming to the phase difference between the input signal N and the output signal OUT; and a loop filter 30' comprising a low-pass filter (LPF) having a low-pass characteristic that blocks high-frequency components from the output voltage of the charge pump 20'. The output voltage of the 30' is input to the voltage-controlled oscillator 40' as the control voltage.

FIG. 11 is a diagram useful in describing the structures of the charge pump 20' and voltage-controlled oscillator 40'. When the UP signal output from the phase comparator 10 is in the active state in FIG. 11, a first switch 202 in the charge pump 20' having the UP signal input to its control terminal is closed. As a result, a constant current from a first constant-current source 201, which is connected between a high-potential power supply (VDD) and one end of the first switch 202 and outputs a source current, is charged in a capacitor 205 having its one end connected to the other end of the first switch 202 and its other end connected to a low-potential power supply (GND). This causes the terminal voltage of the capacitor 205 to rise. The terminal voltage of the capacitor 205 is input as a control voltage to a non-inverting input terminal (+) of the voltage-control led oscillator 40' via a loop filter (not shown). Owing to the rise in the terminal voltage of the capacitor 205, control is performed in such a manner that the oscillation frequency of the voltage-control led oscillator 40' rises so that the phase of the output signal OUT of frequency divider 50 applied to the phase comparator 10 of FIG. 10 is advanced and approaches the phase of input signal IN.

On the other hand, when the DOWN signal output from the phase comparator 10 is in the active state, a second switch 203 having the DOWN signal input to its control terminal and having one end thereof connected to one end of the capacitor 205 is closed. As a result, the capacitor 205 is discharged by a constant current from a second constant-current source 204, which is connected between the low-potential power supply (GND) and the other end of the second switch 203. This causes the terminal voltage of the capacitor 205 to fall. Owing to the fall in the terminal voltage of the capacitor 205, control is performed in such a manner that the oscillation frequency of the voltage-control led oscillator 40' declines so that the phase of the output signal OUT of frequency divider 50 applied to the phase comparator 10 is delayed and approaches the phase of input signal IN.

Thus, in the PLL circuit shown in FIG. 10, the terminal voltage of the capacitor 205 (see FIG. 11) varies in dependence upon the UP and DOWN signals output from the phase comparator 10, as a result of which the output signal OUT and input signal IN from the frequency divider 50 are subjected to phase synchronization control.

With reference again to FIG. 11, the voltage-controlled oscillator 40' includes a voltage-to-current converter (V/I) 41 and a current-controlled oscillator (ICO) 42. The voltage-to-current converter 41, which has a non-inverting input terminal (+) connected to the non-inverting input terminal (+) of the voltage-control led oscillator 40', receives the terminal voltage of the capacitor 205, namely the output terminal voltage of the loop filter 30', as its input, has a reference voltage (Vref) of a preset fixed potential supplied to an inverting input terminal (−) outputs a current corresponding to the difference voltage between the voltage applied to the non-inverting input terminal (+) and the reference voltage Vref. The current-controlled oscillator 42, to which the output current of the voltage-to-current converter 41 is input as a control current, oscillates at a frequency that conforms to the above-mentioned control current.

FIG. 12 is a diagram illustrating an example of the circuit structure of the charge pump 20' in this PLL circuit. As shown in FIG. 12, the charge pump 20' has P-channel MOS transistors PM1, PM2 and PM3 the sources whereof are connected to the high-potential power supply (VDD). The gate and drain of the P-channel MOS transistor PM2 are connected, the gate of the P-channel MOS transistor PM3 and the gate of the P-channel MOS transistor PM2 are connected together, the UP signal output from the phase comparator 10 is input to the gate of the P-channel MOS transistor PM1, and the drain of the P-channel MOS transistor PM1 is connected to the common-connected gates of the P-channel MOS transistors PM2 and PM3.

The charge pump 20' further includes N-channel MOS transistors NM1, NM2 and NM3 the sources whereof are connected to the low-potential power supply (GND). The gate and drain of the N-channel MOS transistor NM2 are connected, the gate of the N-channel MOS transistor NM3 and the gate of the N-channel MOS transistor NM2 are connected together, the DOWN signal output from the phase comparator 10 is input to the gate of the N-channel MOS transistor NM1, and the drain of the N-channel MOS transistor NM1 is connected to the common-connected gates of the N-channel MOS transistors NM2 and NM3.

The drain of the P-channel MOS transistor PM2 is connected to the output terminal of a first constant-current source 21, the drain of the N-channel MOS transistor NM2 is connected to the output terminal of a first constant-current source 22, and the drain of the P-channel MOS transistor PM3 and the drain of the N-channel MOS transistor NM3 are connected together and further connected to the input terminal of the loop filter 30' and to the non-inverting input terminal (+) of the voltage-controlled oscillator 40'.

The P-channel MOS transistors PM2, PM3 construct a first current mirror circuit 23 and the N-channel MOS transistors NM2, NM3 construct a second current mirror circuit 24. When the P-channel MOS transistor PM1 turns on (i.e. when the UP signal is at the high level), the first current mirror circuit 23 reflects the current value of the first constant-current source 21 supplied to the drain of the P-channel MOS transistor PM2 serving as the input terminal to this mirror circuit, whereby the current value is output from the drain of the P-channel MOS transistor PM3 serving as the output terminal. When the N-channel MOS transistor NM1 turns on (i.e., when the DOWN signal is at the low level), the second current mirror circuit 24 reflects the current value of the second constant-current source 22 supplied to the drain of the N-channel MOS transistor NM2 serving as the input terminal to this mirror circuit, whereby the current value is output from the drain of the N-channel MOS transistor NM3 serving as the output terminal.

In the circuit arrangement shown in FIG. 12, the loop filter 30' includes a capacitor $C_0$ charged and discharged by the charge pump 20' and the terminal voltage of which forms the output terminal voltage of the loop filter 30'. It goes without saying that a low-pass filter of a desired characteristic or construction may be provided across one end of the capacitor $C_0$ charged and discharged by the charge pump 20' and the non-inverting input terminal (+) of the voltage-controlled oscillator 40'.

In response to the UP signal supplied by the phase comparator 10, the current from the first constant-current source 21 of charge pump 20' is reflected by the first current mirror circuit 23 and a current P from the P-channel MOS transistor PM3 is supplied to the capacitor of the loop filter 30' the output terminal of which is connected to the non-inverting input terminal (+) of the voltage-controlled oscillator 40'. In response to the DOWN signal supplied by the phase comparator 10, the constant current from the second constant-current source 22 is reflected by the second current mirror circuit 24 and a current N from the N-channel MOS transistor NM3 is supplied to the capacitor of the loop filter 30' the output terminal of which is connected to the non-inverting input terminal (+) of the voltage-controlled oscillator 40'. The oscillation frequency of the voltage-control led oscillator 40' rises and falls in dependence upon the rise and fall of the terminal voltage impressed upon the non-inverting input terminal (+).

The phase comparator 10 again compares the phases of the input signal IN and of the output signal OUT, which is obtained by frequency-dividing, by the frequency divider 50, the output signal from the voltage-controlled oscillator 40' the oscillation frequency whereof has risen or fallen in conformity with the control voltage input thereto. The phase comparator 10 produces and outputs the UP and DOWN signals in accordance with the result of the phase comparison.

FIGS. 13A, 13B and 13C are diagrams illustrating an example of the structure of the voltage-control led oscillator 40'. FIG. 13A is a diagram showing an example of the structure of the voltage-to-current converter 41 depicted in FIG. 11. As shown in FIG. 13A, the voltage-to-current converter has P-channel MOS transistor PM42 and PM42 the sources of which are connected together and further connected to a constant-current source $I_0$ which supplies a reference current, and the gates of which have an output voltage (Vin) of the loop filter (LPF) 30' that enters from the non-inverting input terminal (+) and the reference voltage (Vref) supplied to the inverting input terminal (−), respectively, input thereto. The drain of the P-channel MOS transistor PM41 is connected to the low-potential power supply (GND), the drain of the P-channel MOS transistor PM42 is connected to the drain of an N-channel MOS transistor NM41 whose source is connected to GND potential and whose drain and gate are connected together, and a current is output from the drain of an N-channel MOS transistor NM41 whose drain is connected to the gate of the N-channel MOS transistor NM41 and whose source is connected to GND potential. The N-channel MOS transistors NM41 and NM42 construct a current mirror circuit. A drain current corresponding to a difference voltage between the input voltage (control voltage) Vin from the non-inverting input terminal (+) and the reference voltage (Vref) is output from the P-channel MOS transistor PM42 and applied to the input terminal of the current mirror circuit. The mirror current is output from the drain of the N-channel MOS transistor NM42, which forms the output terminal of the current mirror, as a control current Iout for the current-controlled oscillator.

When the input voltage (Vin) from the non-inverting input terminal (+) and the reference voltage (Vref) are equal, the drain current of the P-channel MOS transistor PM42 becomes one-half the constant current $I_0$, the control current Iout becomes $I_0/2$ and the voltage-controlled oscillator 40' oscillates at a center frequency of the range of oscillation frequencies.

When the input voltage (Vin) from the non-inverting input terminal (+) is greater than the reference voltage (Vref), the drain current that flows into the P-channel MOS transistor PM41 becomes smaller than $I_0/2$, the drain current that flows into the P-channel MOS transistor PM42 becomes larger than $I_0/2$ and the oscillation frequency of the voltage-control led oscillator 40' becomes higher than the center frequency thereof.

When the input voltage (Vin) from the non-inverting input terminal (+) is smaller than the reference voltage (Vref), on the other hand, the drain current that flows into the P-channel MOS transistor PM41 becomes larger than $I_0/2$, the drain current that flows into the P-channel MOS transistor PM42 becomes smaller than $I_0/2$ and the oscillation frequency of the voltage-controlled oscillator 40' falls below the center frequency thereof.

FIG. 13B is a diagram illustrating an example of the structure of the current-controlled oscillator (ICO) 42. As shown in FIG. 13B, the current-control led oscillator 42 includes a P-channel MOS transistor PM43 whose source is connected to the high-potential power supply (VDD) and whose gate and drain are connected together and further connected to a control-current input terminal; a ring oscillator comprising an odd number (three in the illustrated example) of inverters 301, 302, 303 and having its output terminals connected to its input terminals; and a voltage comparator 304 which produces an output signal (the ICO output) upon receiving the differential voltage output of the final stage inverter 303 of the ring oscillator.

FIG. 13C is a diagram illustrating an example of the circuit construction of the inverters constituting the ring oscillator of the current-controlled oscillator 42. As shown in FIG. 13C, each inverter comprises a differential amplifier circuit having a P-channel MOS transistor PM44 the source and gate of which are connected to a power supply and to a G terminal, respectively, and which acts as constant-current source; and P-channel MOS transistors PM45 and PM46 the sources of which are connected together and to the drain of the P-channel MOS transistor PM44, the gates of which are connected to differential input terminals 11, 12, respectively, and the drains of which are connected to the GND potential via load resistors R1, R2, respectively, and to differential output terminals 01, 02, respectively. The G terminal of the inverter is connected to the gate of the P-channel MOS transistor PM43. That is, the input control current is converted to voltage by the P-channel MOS transistor PM44 and the current values of the constant-current sources of the differential amplifiers of inverters 301, 302 and 303 are varied based upon this voltage, thereby varying the delay time per inverter stage and varying the oscillation frequency. The oscillator output is delivered from the output terminal of the voltage comparator 304 to which the differential output from the inverter 303 is applied as a differential input. When the input control current $I_{in}$ increases, the potential of the G terminal of inverter falls and the current that flows into the P-channel MOS transistor PM44 constituting the constant-current source of the differential pair of the inverter increases to speed up the inverting operation of the inverter. As a result, the oscillation frequency of the ring oscillator rises. When the input control current $I_{in}$ decreases, on the other hand, the potential of the G terminal of inverter rises and the current that flows into the P-channel MOS transistor PM44 constituting the constant-current source of the differential pair of the inverter decreases to slow down the inverting operation of the inverter. As a result, the oscillation frequency of the ring oscillator falls.

The inverters 301–303 constructing the ring oscillator of the current-controlled oscillator may of course be constituted by clocked inverters rather than by differential circuits.

Described next will be an example of the operation of a PLL circuit for reading data out of a recording disk and synchronizing the phase of a read clock to that of input data.

FIGS. 14A and 14B are timing waveform diagrams illustrating an operation for timing input data applied to the phase comparator 10 (see FIG. 10) of the PLL circuit, the output signal (the read clock) of the frequency divider 50 (FIG. 10) and the UP and DOWN signals output from the phase comparator 10.

In the example shown in FIG. 14A, the UP signal in the phase comparator 10 makes a transition from the low to the high level in sync with the rising edge of the input data in a cycle t0 of the read clock. In the next cycle t1, the UP signal makes a transition to the low level in sync with the rising edge of the read clock rising from the low to the high level (i.e., the UP signal takes on a pulse width that corresponds to the phase lag of the read signal relative to the change in the input data). After the UP signal makes this transition to the low level, the DOWN signal rises in sync with the rising edge of the read clock in cycle t2 and then falls in sync with the falling edge of the read clock (the pulse width of the DOWN signal is that of the read clock). In cycle t3 of the read clock, the UP signal makes a transition from the low to the high level in sync with the falling edge of the input data. In cycle t4, the UP signal makes a transition to the low level in sync with the rising edge of the read clock rising from the low to the high level.

If the phases of the input data and read clock are synchronized, the pulse width of the UP signal and the pulse width of the DOWN signal will coincide and will take on the pulse width of the read clock.

In the example shown in FIG. 14B, the UP signal in the phase comparator 10 makes a transition from the low to the high level in sync with the rising edge of the input data in a cycle t0 of the read clock. In the next cycle t1, the UP signal makes a transition to the low level in sync with the falling edge of the read clock falling from the high to low high level and the DOWN signal makes a transition from the low to the high level. In cycle t2, the DOWN signal makes a transition to the low level in sync with the falling edge of the read clock. In cycle t3 of the read clock, the UP signal makes a transition from the low to the high level in sync with the falling edge of the input data. In the next cycle t4, the UP signal falls to the low level and the DOWN signal makes a transition from the low to the high level in sync with the falling edge of the read clock. In the next cycle t5, the DOWN signal falls to the low level in sync with the falling edge of the read clock.

If the phases of the input data and read clock are synchronized in the example of FIG. 14B, the pulse width of the UP signal and the pulse width of the DOWN signal will coincide and will take on one period of the read clock.

SUMMARY OF THE DISCLOSURE

In the course of investigations toward the present invention, various problems have been encountered. In the following, analysis on such problems will be given.

Namely, the prior-art PLL circuit described has a number of problems, which will now be set forth.

In the charge pump 20' shown in FIG. 12, the ratio of the value of the current (P) which charges the loop filter 30' when the UP signal is active to the value of the current (N) that discharges the electric charge that has accumulated in the loop filter 30' when the DOWN signal is active is decided by the input/output characteristic (which is related to the transconductance coefficient β, which stipulates the current driving capability of the active element, and the threshold value $V_{TH}$ of the element) of the P-channel MOS transistor PM3 forming the output terminal of the first current mirror circuit 23 and the input/output characteristic of the N-channel MOS transistor NM3 forming the output terminal of the second current mirror circuit 24.

As a result, in order to equalize the charging current in the UP operation when the UP signal is active and the discharge current in the DOWN when the DOWN signal is active in the charge pump 20', it is necessary to adopt an arrangement in which identical current values can be output from the P-channel MOS transistor PM3 and N-channel MOS transistor NM3 (see FIG. 12), which have element structures that differ from each other. Owing to this difference in element structure, the output currents from the P- and N-channel MOS transistors the conductivity types of which differ usually exhibit a disparity (deviation) which is larger than the case between MOS transistors of the same conductivity type.

In order to obtain identical current driving capabilities which decide the output characteristics of the P-channel MOS transistor PM3 and N-channel MOS transistor NM3 forming the output terminals of the first and second current mirror circuits 23, 24 of charge pump 20', it is necessary to employ a design and construction different from that of the other MOS transistors which constitute the internal circuitry of the semiconductor IC that includes the PLL circuit. For example, the transconductance ratio $β_P/β_N$ of the P-channel MOS transistor and M-channel MOS transistor is made 1 [where β is given by $(W/L)μC_{OX}$, W represents channel width, L represents channel length, μ represents the effective surface mobility of the carriers, $C_{OX}$ represents the gate capacity per unit surface area and $C_{OX}=ϵ/t_{OX}$ holds where ϵ is the dielectric constant of the gate insulating film and $t_{OX}$ is the film thickness of the gate insulating film].

Even if a design is adopted so as to equalize the current values of the output currents from the P-channel MOS transistor PM3 and N-channel MOS transistor NM3 constituting the output terminals of the first and second current mirror circuits 23, 24, respectively, of the charge pump 20', a difference (deviation) develops between the output currents owing to differences in the structures of the P- and M-channel MOS transistors, which have different element structures.

In a PLL circuit so adapted that the pulse width of the UP signal and the pulse width of the DOWN signal take on equal values at the moment the input data and read data are synchronized in phase, phase synchronization is performed correctly in a case where the ratio of the output current (P) from the P-channel MOS transistor PM3 constituting the output terminal of the first current mirror circuit 23 of charge pump 20' to the output current (N) of the N-channel MOS transistor NM3 constituting the output terminal of the second current mirror circuit 24 is 1:1, namely when the output current (P) and output current (N) are 10 μA, as indicated in Example 1 in FIG. 6.

However, if the ratio of the output current (P) from the P-channel MOS transistor PM3 of charge pump 20' to the output current (N) of the N-channel MOS transistor NM3 is not 1:1, e.g., if the ratio is 1.2:1 (P=12 μA, N=10 μA), as indicated by Example 2 in FIG. 6, then the ratio of the charging current (P) at the time of the UP operation of charge pump 20' to the discharge current (N) at the time of the DOWN operation will be 1.2:1.

As a result, at the moment the phases of the input signal and the output signal applied to the phase comparator 10 coincide and the pulse widths of the UP and DOWN signals output from the phase comparator 10 become equal, a voltage higher than the output voltage at the original phase synchronization point is impressed upon the non-inverting input terminal of the voltage-controlled oscillator 40', and the latter oscillates with its phase advanced over that which prevails at the phase synchronization point at the original oscillation frequency. The reason for this as follows: When the pulse widths of the UP and DOWN signals become equal, the capacitor of the loop filter 30' is charged in the active interval of the UP signal by the charging current (P) the current value of which is greater than that of the discharge current (N), and the capacitor is discharged in the active interval of the DOWN signal (this interval has the same length as that of the UP-signal active interval) by the discharge current (N). As a consequence, electric charge equivalent to the difference current between the charging current (P) and discharge current (N) multiplied by the length of time of the pulse width of the UP signal accumulates in the capacitor. This electric charge divided by the capacitance value C of the capacitor acts as an offset voltage and results in a higher capacitor terminal voltage.

Thus, if the ratio of the charging current (P) at the time of the UP operation of charge pump 20' to the discharge current (N) at the time of the DOWN operation is not 1:1, the charge pump 20' cannot output the voltage (detected by the phase comparator 10) corresponding to the phase difference between the input and output signals to the voltage-controlled oscillator 40'. As a consequence, the PLL circuit cannot perform phase synchronization correctly in a state in which the phase difference between the input and output signals is zero.

If synchronization (locking) occurs in a PLL circuit in a state in which the input data and read clock are not in phase (i.e., a state in which the phase difference is not zero), a signal which is not the original input data will be decoded as the input data in a circuit that is for decoding input data using a read clock output from the PLL circuit. This means that the correct data cannot be read out. A serious problem can result, such as not being able to read data out of a recording medium correctly.

In order to raise the transfer rate of a CD (Compact Disk)-ROM or DVD (Digital Versatile Disk) used as the storage medium in modern information processing systems, the disk is read at high speed at rotational speed of 4×, 8×, 16× or 32×. In such case, input data applied to a PLL circuit after being read out of a storage disk by an optical head, amplified and then binarized exhibits jitter. The increase in the speed of the input signal is accompanied by an increase in the percentage of the input-signal period occupied by the duration of input-signal jitter. In a case where the PLL locks in a state in which the input data and read clock are out of phase owing to a difference or variation in the output current characteristics of the P- and N-channel MOS transistors constituting the output stage of the charge pump in the PPL circuit, as mentioned above, resistance to input-signal jitter declines markedly and phase synchronization with respect to the input signal cannot be achieved owing to the effects of jitter.

In order to correct for the output-current disparity of the P- and N-channel MOS transistors constituting the output stage of the charge pump 20' in the PLL circuit according to the prior art, it is necessary to adjust the PLL circuit or playback device after the manufacture thereof in such a manner that the ratio of the current value of the charging current (P) to the current value of the discharge current (N) of the charge pump 20' will be 1:1. Consequently, it is additionally necessary to mount a correction circuit on the PLL circuit and to add a correction step executed after product manufacture. This invites an increase in cost.

Accordingly, it is an object of the present invention to provide a novel apparatus which is freed of/or eliminated from any of the aforementioned problems. Specifically, an object according to an aspect of the present invention is to provide a charge pump, a PLL circuit and/or a data read-out circuit, which includes the PLL circuit, that are unaffected by differences in element manufacture so that the result of a phase comparison can be converted to voltage in highly precise fashion.

Further aspects and/or objects will become apparent in the entire disclosure.

According to a first aspect of the present invention, there is provided a PLL circuit in which a phase difference detected by a phase comparator is converted to a voltage by a charge pump, smoothed by a loop filter and input to a voltage-controlled oscillator as a control voltage, and an output signal from the voltage-control led oscillator, or an output signal obtained by frequency-dividing the output of the voltage-controlled oscillator by a frequency divider, is fed back and input to the phase comparator to have its phase compared with that of an input signal. In the PLL circuit, the voltage-controlled oscillator has a non-inverting input terminal and an inverting input terminal, a difference voltage between terminal voltages impressed upon respective ones of the non-inverting and inverting input terminals is input to the voltage-controlled oscillator as the control voltage so that the voltage-controlled oscillator will oscillate at a frequency in accordance with this control voltage. Further, the charge pump has a control unit performing of: (i) enlarging or (ii) reducing the difference voltage between both variable terminal voltages of non-inverting and inverting terminals of the voltage controlled oscillator in accordance with an output from the phase comparator representing the result of the phase comparison. The control of enlarging the difference is performed by raising the terminal voltage of the non-inverting input terminal and lowering the terminal voltage of the inverting input terminal of the voltage-controlled oscillator in dependence upon an output from the phase comparator representing the result of the phase comparison, thereby enlarging the difference voltage between the terminal voltages of the non-inverting and inverting input terminals. The control of reducing the difference is performed by lowering the terminal voltage of the non-inverting input terminal and raising the terminal voltage of the inverting input terminal of the voltage-controlled oscillator in dependence upon an output from the phase comparator representing the result of the phase comparison, thereby reducing the difference voltage between the terminal voltages of the non-inverting and inverting input terminals.

According to a second aspect of the present invention, there is provided a PLL circuit comprising: a voltage-controlled oscillator having a non-inverting input terminal and an inverting input terminal, wherein a difference voltage between terminal voltages impressed upon respective ones of the non-inverting and an inverting input terminals is input to the voltage-control led oscillator as a control voltage so that the voltage-control led oscillator will oscillate at a frequency in accordance with this control voltage;

a phase comparator for comparing phase of an output signal from the voltage-control led oscillator, or phase of an output signal obtained by frequency-dividing the output of the voltage-control led oscillator by a frequency divider, and phase of an input signal and outputting result of this phase comparison;

first and second loop filters connected at output terminals thereof to the non-inverting and inverting input terminals, respectively, of the voltage-controlled oscillator;

a first circuit, which is responsive to receipt of a first control signal output as a result of the phase comparison by the phase comparator, for supplying a first charging current (P1) from a first transistor of a first conductivity type to a capacitor of the first loop filter that supplies the terminal voltage to the non-inverting input terminal of the voltage-controlled oscillator, and a first discharge current (N1) from a first transistor of a second conductivity type to a capacitor of the second loop filter that supplies the terminal voltage to the inverting input terminal of the voltage-controlled oscillator; and a second circuit which is responsive to receipt of a second control signal output as a result of the phase comparison by the phase comparator, for supplying a second charging current (P2) from a second transistor of the first conductivity type to the capacitor of the second loop filter that supplies the terminal voltage to the inverting input terminal of the voltage-control led oscillator, and a second discharge current (N2) from a second transistor of the second conductivity type to the capacitor of the first loop filter that supplies the terminal voltage to the non-inverting input terminal of the voltage-controlled oscillator;

wherein the ratio of a sum current (P1+N1) obtained by summing the first charging current (P1) and the first discharge current (N1) to a sum current (P2+N2) obtained by summing the second charging current (P2) and the second discharge current (N2) is capable of being set to 1:1 independently of a difference in output characteristics between the transistors of the first conductivity type and the transistors of the second conductivity type.

The entire features disclosed in the claims are incorporated herein by reference thereto, which is deemed to constitute a part of the disclosure.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 6 is a diagram useful in describing the present invention in comparison with the prior art;

PREFERRED EMBODIMENTS OF THE INVENTION

Preferred modes of practicing the present invention will now be described.

Figure 1:
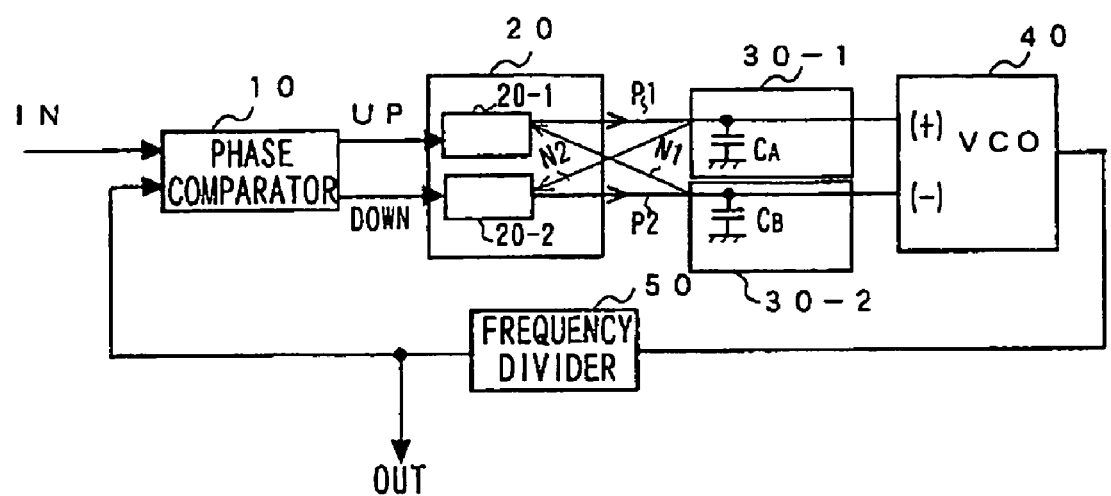
FIG. 1 is a diagram illustrating the basic structure of an embodiment according to the present invention.

As shown in FIG. 1, a PLL circuit according to a preferred mode of the present invention comprises: a voltage-controlled oscillator VCO (40) having a non-inverting input terminal (+) and an inverting input terminal (−), wherein a difference voltage (signal) between terminal voltages impressed upon respective ones of the non-inverting and an inverting input terminals is input to the voltage-control led oscillator as a control voltage so that the voltage-control led oscillator will oscillate at a frequency in accordance with this control voltage; a phase comparator (10) for comparing the phase of an output signal from the voltage-control led oscillator (40), or the phase of a signal (OUT) obtained by frequency-dividing the output of the voltage-control led oscillator (40) by a frequency divider 50, and phase of an input signal (IN) and outputting result of this phase comparison (UP and DOWN signals); first and second loop filters (30-1, 30-2) connected at output terminals thereof to the non-inverting input terminal (+) and inverting input terminal (−), respectively, of the voltage-controlled oscillator (40); and a charge pump (20) having a first circuit module (20-1) which, when a first control signal (UP signal) output from the phase comparator (10) for raising the oscillation frequency of the voltage-control led oscillator (40) is in an active state, charges a first capacitor (CA), which applies the terminal voltage from the output terminal of the first loop filter (30-1), by a constant current (P1), thereby increasing the terminal voltage [the terminal voltage of the non-inverting input terminal (+) of the voltage-controlled oscillator (40] at the output terminal of the first loop filter (30-1), and discharges accumulated charge of a second capacitor (CB), which applies the terminal voltage from the output terminal of the second loop filter (30-2), by a constant current (N1), thereby decreasing the terminal voltage the terminal voltage of the inverting input terminal (−) of the voltage-control led oscillator (40) at the output terminal of the second loop filter (30-2), and a second circuit module (20-2) which, when a second control signal (DOWN signal) output from the phase comparator (10) for lowering the oscillation frequency of the voltage-control led oscillator (40) output is in an active state, discharges accumulated charge of the first capacitor (CA), which applies the terminal voltage from the output terminal of the first loop filter (30-1), by a constant current (N2), thereby decreasing the terminal voltage at the output terminal of the first loop filter (30-1), and charges the second capacitor (CB), which applies the terminal voltage from the output terminal of the second loop filter (30-2), by a constant current (P2), thereby increasing the terminal voltage at the output terminal of the second loop filter (30-2).

Figure 2:
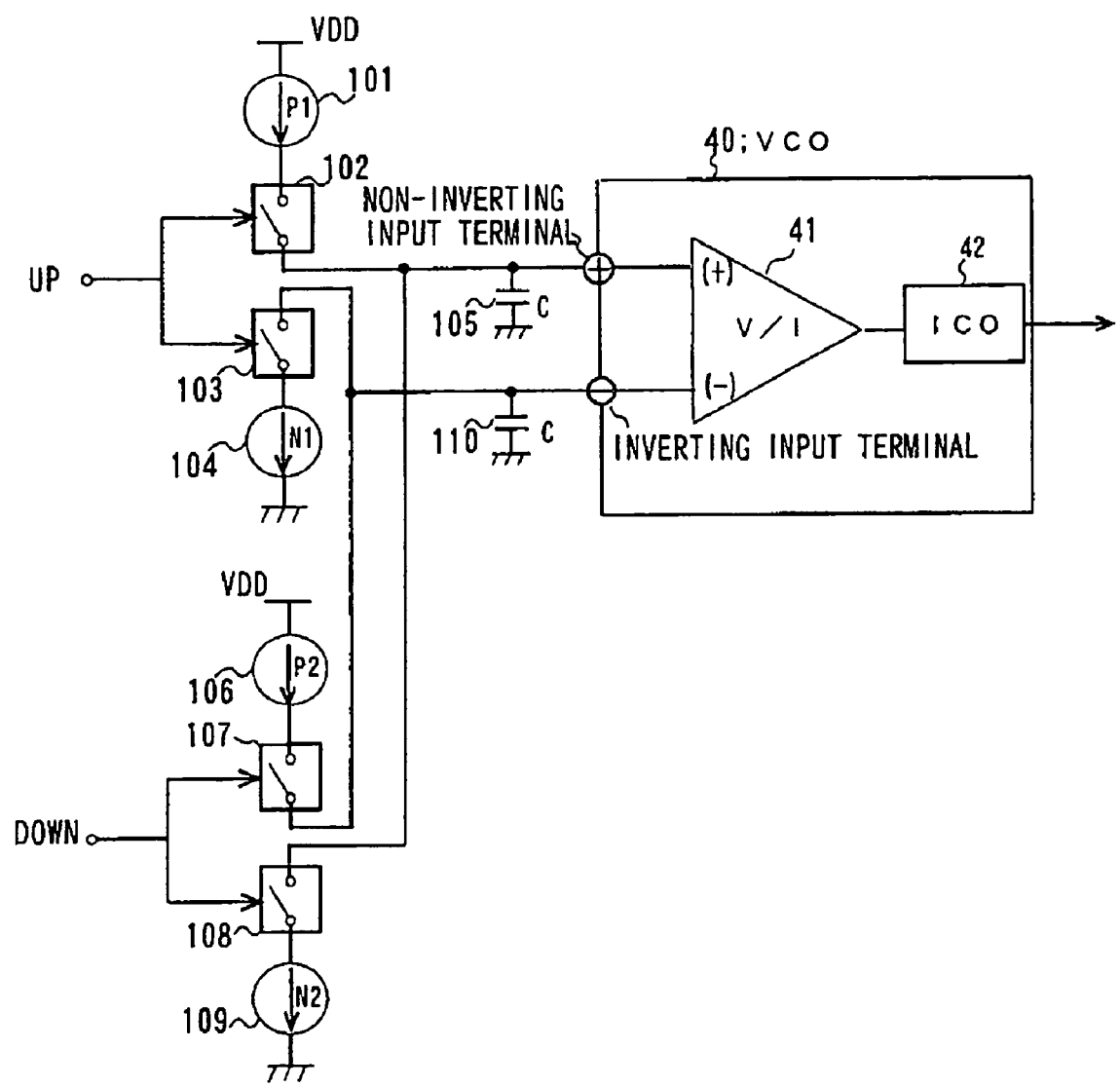
FIG. 2 is a diagram useful in describing the structure of a charge pump according to this embodiment of the present invention.

In a preferred mode of the present invention, as shown in FIG. 2 the charge pump of the PLL circuit includes: a first switch (102) having a control terminal connected to a first control signal (UP); a first constant-current source (101) connected between a high-potential power supply (VDD) and one end of the first switch (102); a first capacitor (105) having one end connected to the other end of the first switch (102) and having its other end connected to a low-potential power supply (GND); a second switch (103) having a control terminal connected to the first control signal (UP); a second constant-current source (104) connected between the low-potential power supply (GND) and one end of the second switch (103); a second capacitor (110) having one end connected to the other end of the second switch (103) and having its other end connected to the low-potential power supply (GND); a third switch (107) having a control terminal connected to a second control signal (DOWN); a third constant-current source (106) connected between the high-potential power supply (VDD) and one end of the third switch (103); a fourth switch (108) having a control terminal connected to the second control signal (DOWN); and a fourth constant-current source (109) connected between the low-potential power supply (GND) and one end of the fourth switch (108); wherein the other end of the third switch (107) is connected to the one end of the second capacitor (110) and the other end of the fourth switch (108) is connected to the one end of the first capacitor (105).

When the first control signal (UP) is in the active state, the first switch (102) turns on and supplies the constant current from the first constant-current source (101) to the first capacitor (105) to charge the same, and the second switch (103) also turns on to discharge the second capacitor (110) by the constant current from the second constant-current source (104), thereby promptly enlarging the difference voltage between the terminal voltage of the first capacitor (105) and the terminal voltage of the second capacitor (110).

When the second control signal (DOWN) is in the active state, the third switch (107) turns on and supplies the constant current from the third constant-current source (106) to the second capacitor (110) to charge the same, and the fourth switch (108) also turns on to discharge the first capacitor (105) by the constant current from the fourth constant-current source (109), thereby promptly reducing the difference voltage between the terminal voltage of the first capacitor (105) and the terminal voltage of the second capacitor (110). The charge pump circuit delivers the terminal voltage of the first capacitor (105) as an output applied to the non-inverting input terminal and delivers the terminal voltage of the second capacitor (110) as an output applied to the inverting input terminal.

Figure 4:
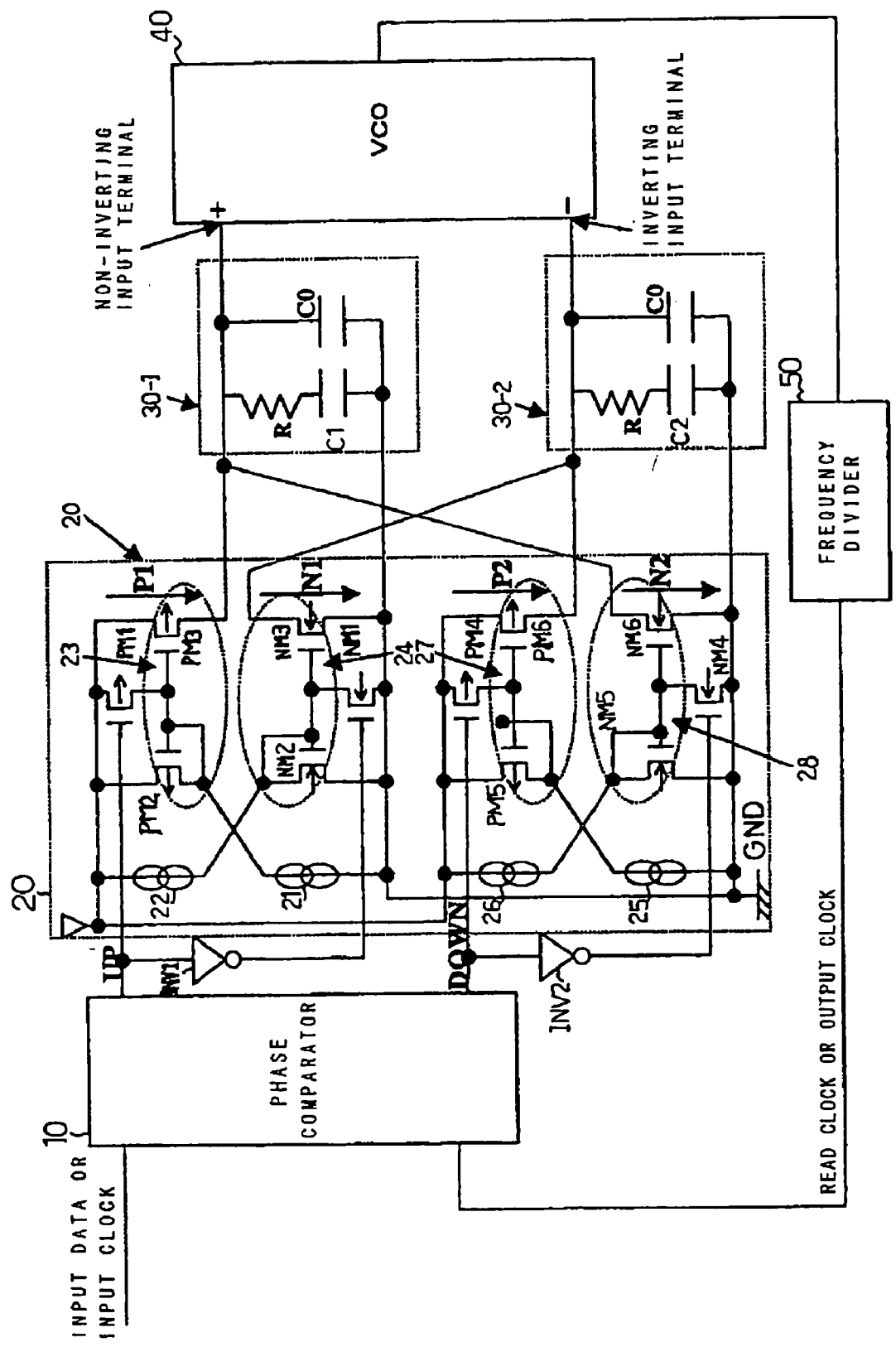
FIG. 4 is a diagram illustrating an example of the circuit structure of a charge pump according to this embodiment of the present invention.

In an example of the structure of the charge pump of the PLL circuit in a preferred mode of the present invention, as shown in FIG. 4, the charge pump includes: a first current mirror circuit (23) comprising first and second transistors (PM2, PM3) of a first conductivity type; a first switch (PM1) having a control terminal to which the first control signal (UP) is input for activating the first current mirror circuit (23) when the first control signal (UP) is in the active state (i.e., at the high level); a first constant-current source (21) connected between an input side of the first current mirror circuit (23) and the low-potential power supply (GND); a second current mirror circuit (24) comprising first and second transistors (NM2, NM3) of a second conductivity type that is opposite the first conductivity type; a second switch (NM1) having a control terminal to which an inverse signal of the first control signal (UP) is input for activating the second current mirror circuit (24) when the first control signal (UP) is in the active state; a second constant-current source (22) connected between an input terminal of the second current mirror circuit (24) and a high-potential power supply (VDD); a third current mirror circuit (27) comprising third and fourth transistors (PM5, PM6) of the first conductivity type; a third switch (PM4) having a control terminal to which the second control signal (DOWN) is input for activating the third current mirror circuit (27) when the second control signal (DOWN) is in the active state; a third constant-current source (25) connected between an input terminal of the third current mirror circuit (27) and the low-potential power supply (GND); a fourth current mirror circuit (28) comprising third and fourth transistors (NM5, NM6) of the second conductivity type; a fourth switch (NM4) having a control terminal to which an inverse signal of the second control signal (DOWN) is input for activating the fourth current mirror circuit (28) when the second control signal (DOWN) is in the active state; and a fourth constant-current source (26) connected between an input side of the fourth current mirror circuit (28) and the high-potential power supply (VDD); wherein the output terminal of the first current mirror circuit (23) and the output terminal of the fourth current mirror circuit (28) are connected in common with the input terminal of the first loop filter (30-1), and the output terminal of the second current mirror circuit (24) and the output terminal of the third current mirror circuit (27) are connected in common with the input terminal of the second loop filter (30-2).

When the first control signal (UP) output from the phase comparator (10) is in the active state, the constant current from the first constant-current source (21) is reflected by the first current mirror circuit (23) so that the first charging current (P1) is supplied from the transistor (PM3) of the first conductivity type, which forms the output terminal of the first current mirror circuit (23), to the capacitor of the first loop filter (30-1) that supplies the terminal voltage to the non-inverting input terminal (+) of the voltage-controlled oscillator VCO (40), and the constant current from the second constant-current source (22) is reflected by the second current mirror circuit (24) so that the first discharge current (N1) is supplied from the transistor (NM3) of the second conductivity type, which forms the output terminal of the second current mirror circuit (24), to the capacitor of the second loop filter (30-2) that supplies the terminal voltage to the inverting input terminal (−) of the voltage-controlled oscillator (40).

When the second control signal (DOWN) output from the phase comparator (10) is in the active state, the constant current from the third constant-current source (25) is reflected by the third current mirror circuit (27) so that the second charging current (P2) is supplied from the transistor (PM6) of the first conductivity type, which forms the output terminal of the third current mirror circuit (27), to the capacitor of the second loop filter (30-2) that supplies the terminal voltage to the inverting input terminal (−) of the voltage-controlled oscillator (40), and the constant current from the fourth constant-current source (26) is reflected by the fourth current mirror circuit (28) so that the second discharge current (N2) is supplied from the transistor (NM6) of the second conductivity type, which forms the output terminal of the fourth current mirror circuit (28), to the capacitor of the first loop filter (30-1) that supplies the terminal voltage to the non-inverting input terminal (+) of the voltage-control led oscillator (40). The ratio of sum current (P1+N1) obtained by summing the first charging current (P1) and the first discharge current (N1) to a sum current (P2+N2) obtained by summing the second charging current (P2) and the second discharge current (N2) is capable of being set to 1:1 independently of a difference in output characteristics and difference in manufacture between the transistors of the first conductivity type and the transistors of the second conductivity type, the element structures of which differ.

Thus, the ratio of the current value supplied from the charge pump (20) to the capacitor at the time of the UP operation to the current value supplied from the charge pump (20) to the capacitor at the time of the DOWN operation becomes (P1+P2) (P2+N2).

As a result, this mode of the present invention is such that even when the ratio P:N between the output currents of the transistors of the first and second conductivity types is not 1:1, the ratio between the values of the currents supplied from the charge pump (20) to the capacitors at the time of the UP and DOWN operations will be 1:1 if the output currents (P1 and P2) of the transistors of the first conductivity type in the first and third current mirror circuits are equal and the output currents (N1 and N2) of the transistors of the second conductivity type in the second and fourth current mirror circuits are equal. This is realized by matching the input/output characteristics of transistors having identical element structures, namely the input/output characteristics of the transistors of the first conductivity type and the input/output characteristics of the transistors of the second conductivity type.

The input/output characteristics (current driving capability, threshold-value voltage, etc.) of transistors having identical element structures can be brought to the ratio 1:1 more easily than can the output characteristics of the transistors of the first and second conductivity types having different element structures.

In a case where the ratio of the current driving capability (output current) of the transistors of the first conductivity type in the first and third current mirror circuits to the current driving capability (output current) of the transistors of the second conductivity type in the second and fourth current mirror circuits is 1:a, we have (P11+N1): (P2+N2)=P1(1+a): P2 (1+a). In this case, the ratio between the current values of the currents at the time of the UP operation and at the time of the DOWN operation supplied from the charge pump to the capacitors will be 1:1 if the output currents P1, P2 of the transistors of the first conductivity type in the first and third current mirror circuits are equal, and voltages proportional to the pulse width of the UP signal and the pulse width of the DOWN signal will be supplied to the non-inverting input terminal (+) and inverting input terminal (−) of the voltage-controlled oscillator.

For instance, as indicated by Example 4 in FIG. 6, the ratio between the current values of the currents at the time of the UP operation and at the time of the DOWN operation supplied from the charge pump to the capacitors will be (P1+N1):(P2+N2)

=(12+10):(12+10)

=1:1 even when P1=P2=12 μA, N1=N2=10 μA hold.

Therefore, when the phase difference between the input and output signals of the PLL circuit becomes zero, the pulse widths of the UP and DOWN signals coincide and no problems arise.

More specifically, in accordance with this mode of the present invention, even if the output currents from the respective transistors of the first and second conductivity types having different element structures differ from each other because of differences in manufacture, etc., a voltage corresponding correctly to the phase difference that is output from the phase comparator can be delivered as the difference voltage across the non-inverting and inverting input terminals of the voltage-control led oscillator. As a result, in this mode of practicing the present invention, the problem encountered in the prior art, namely the fact that phase synchronization cannot be performed correctly because a voltage corresponding to the phase difference output by the phase comparator cannot be delivered, does not arise even if the output currents from the respective transistors of the first and second conductivity types having different element structures differ. Of course, as indicated by Example 3 in FIG. 6, an arrangement in which the output currents transistors of the first and second conductivity types coincide may be adopted.

In the PLL circuit according to this mode of practicing the present invention, it is unnecessary to provide the charge pump (20) with a circuit which corrects for the disparity between the output currents of the transistors of the first and second conductivity types constituting the current output stage, and it is unnecessary to provide a step in which an adjustment is applied after manufacture. It is possible to output a voltage corresponding correctly to the difference between the pulse widths of the UP and DOWN signals from the phase comparator (this difference corresponds to the phase difference between the input and output signals). This in turn makes it possible to raise the precision and performance of the PLL circuit and to lower manufacturing cost. Furthermore, it is unnecessary to adopt a design that will equalize the characteristics of transistors of first and second conductivity types, the element structures of which are different, in the current output stage of a charge pump. That is, in the present invention, it will suffice if only the input/output characteristics (or the temperature characteristic or power-supply voltage characteristic, etc.) of transistors of identical conductivity types in the current output stage of the charge pump are the same, and the dependence of the characteristics of the PLL circuit on temperature and power-supply voltage can be reduced even if the characteristics of the transistors of the first and second conductivity types are not in agreement with each other. In the present invention, it is no longer necessary to take transistor size and process of manufacture into account in order to match the characteristics of the transistors of the first and second conductivity types in the current output stage of a charge pump. This shortens the time needed to design the PLL circuit. In addition, since the transistors of the first and second conductivity types can be designed independently of each other, another advantage is that there is greater degree of freedom in terms of design.

Figure 12:
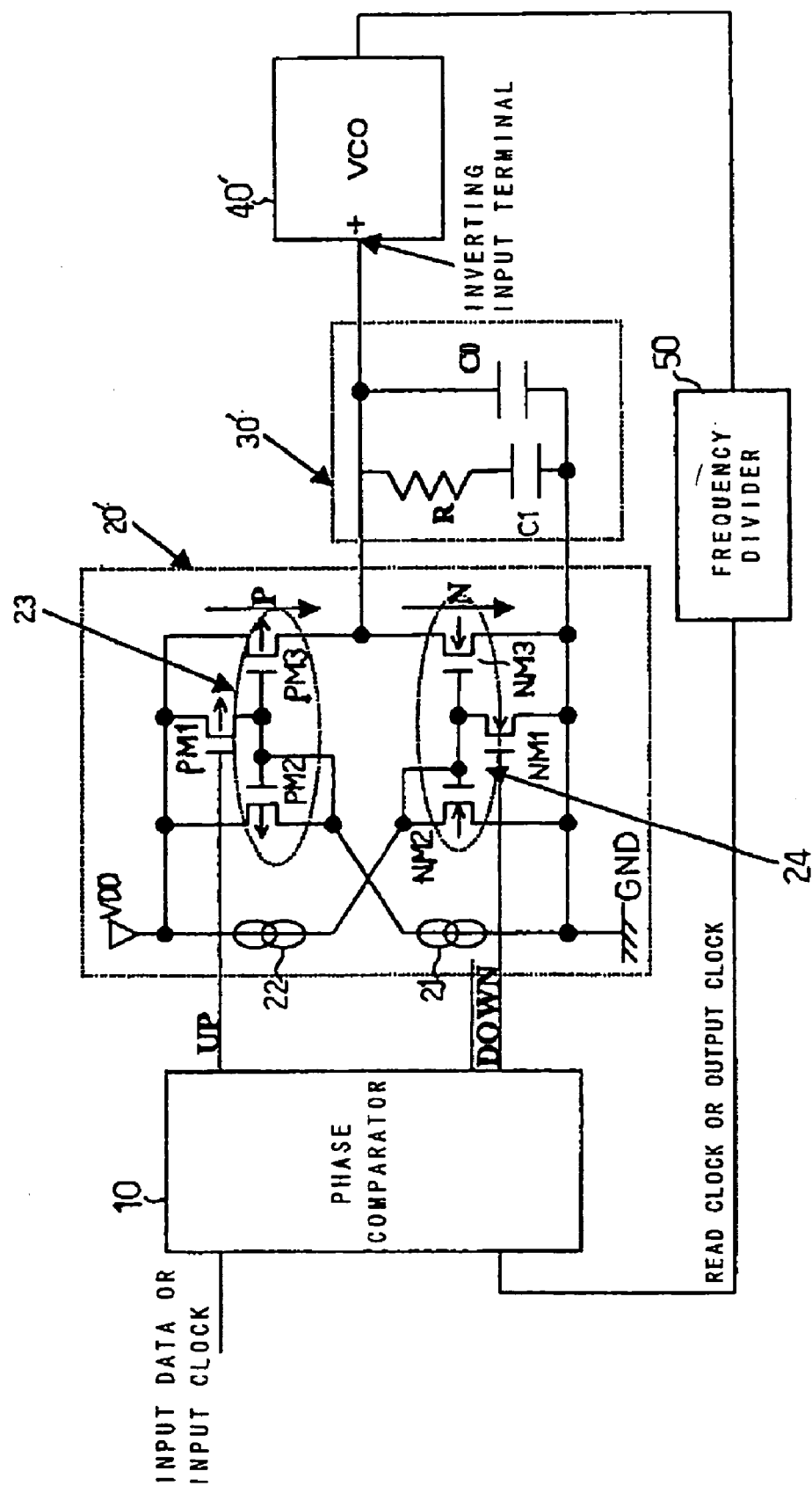
FIG. 12 is a diagram illustrating an example of the structure of a charge pump of a PLL circuit according to the prior art.

In this mode of practicing the present invention, the arrangement is such that the outputs of the charge pump (20) are input in the form of a differential (differential mode) from the non-inverting input terminal (+) and inverting input terminal (−) as output voltages from the respective first and second loop filters (30-1, 30-2). As a result, noise of in-phase components (common mode) is eliminated. That is, in accordance with the present invention, an advantage is that in-phase noise components are suppressed and the quality of signals transmitted from the charge pump to the voltage-controlled oscillator is improved in comparison with the conventional voltage-control led oscillator (see FIG. 12, etc.) of single-end-input type, in which the output voltage of the charge pump (the loop-filter output voltage) is input from the non-inverting input terminal.

In this mode of practicing the present invention, the voltage-control led oscillator (40), as shown in FIG. 2, has a voltage/current conversion circuit (41) for outputting a current that corresponds to a difference voltage between first and second input voltages, the voltage values of which are variable, applied to a non-inverting input terminal (+) and an inverting input terminal (−), and a current-controlled oscillator (42), to which the output current of the voltage/current conversion circuit is input as a control current, for oscillating at a frequency conforming to this control current.

Figure 8:
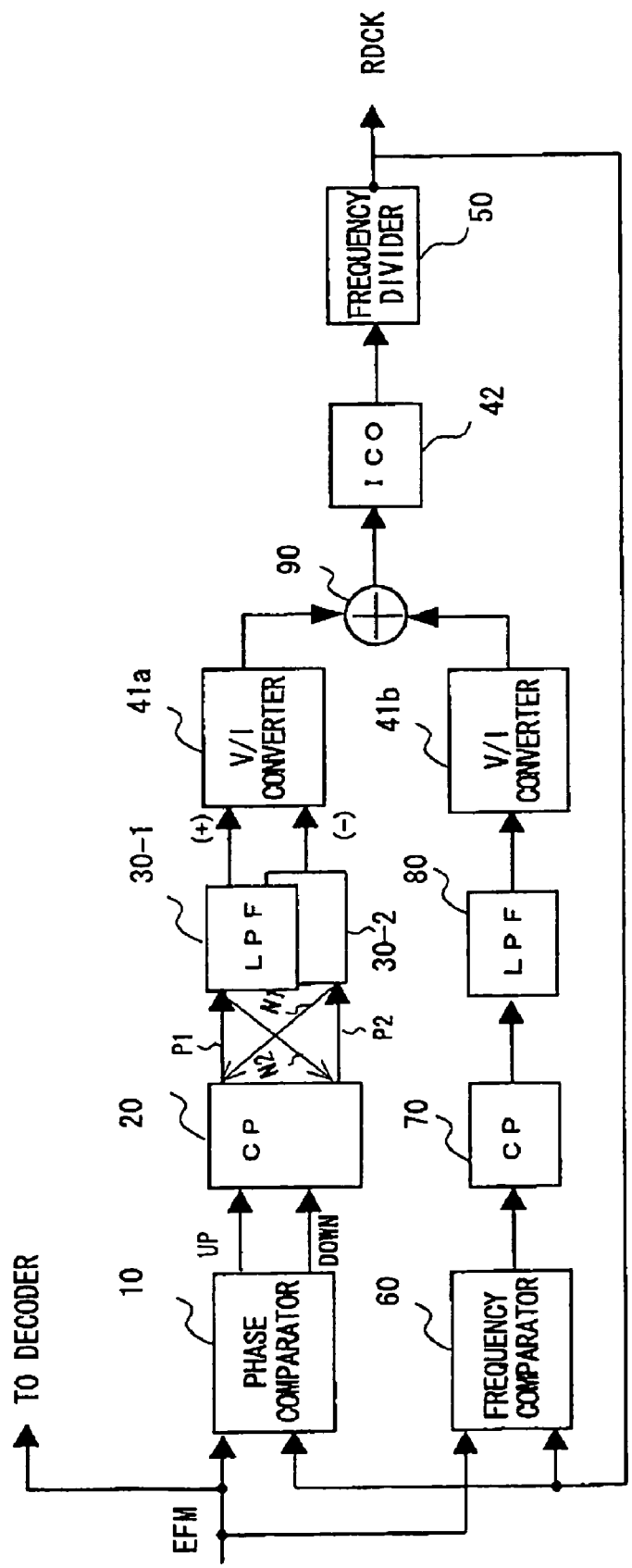
FIG. 8 is a block diagram illustrating the structure of another embodiment of a PLL circuit according to the present invention.

The present invention is applied to a PLL circuit which extracts a read clock from a recording medium (e.g., disk). In this case, as shown in FIG. 8, the PLL circuit includes: a current-controlled oscillator (ICO) (42) generating and outputting a clock signal having a frequency conforming to an entered control current; a frequency divider (50) frequency-dividing the clock signal from the current-controlled oscillator (42); a phase comparator (10), to which an input signal and the clock signal (RDCK) that is output from the frequency divider (50) are input, for outputting an up signal (UP) and a down signal (DOWN) in conformity with phase lag and lead of the clock signal relative to the input signal; a first charge pump (20) producing an output voltage by charging and discharging a capacitor based upon the UP and DOWN signals output from the phase comparator (10); a frequency comparator (60), to which the input signal and the clock signal that is output from the frequency divider (50) are input, for detecting a frequency error by measuring a synchronization pattern of the input signal using the clock signal output from the frequency divider (50); a second charge pump (70) outputting an error voltage that conforms to the frequency error; a first low-pass filter (30) to which the output voltage of the first charge pump (20) is input; a second low-pass filter (80) to which the output voltage of the second charge pump (70) is input; a first voltage/current conversion circuit (41a) converting the output voltage of the first low-pass filter (30) to current; and a second voltage/current conversion circuit (41b) converting the output voltage of the second low-pass filter (80) to current; wherein a sum current obtained by summing the current output from the first voltage/current conversion circuit (41a) and the current output from the second voltage/current conversion circuit (41b) is input to the current-control led oscillator ICO (42) as a control current.

The first voltage/current conversion circuit (V/I converter 41a) has a non-inverting input terminal (+) and an inverting input terminal (−) for outputting a current conforming to a difference voltage between terminal voltages of the non-inverting input terminal (+) and inverting input terminal (−), and the first low-pass filter (30) includes a first loop filter (30-1) and a second loop filter (30-2) connected at output terminals thereof to the non-inverting and inverting input terminals, respectively, of the first voltage/current conversion circuit (41a). The first charge pump (20) has means which, when the UP signal output from the phase comparator (10) is in an active state, charges a first capacitor, which applies the terminal voltage from the output terminal of the first loop filter (30-1), by a constant current output from a first constant-current source, thereby increasing the terminal voltage at the output terminal of the first loop filter (30-1), and discharges a second capacitor, which applies the terminal voltage from the output terminal of the second loop filter (30-2), by a constant current from a second constant-current source, thereby decreasing the terminal voltage at the output terminal of the second loop filter (30-2); and which, when the DOWN signal output from the phase comparator (10) is in an active state, discharges the first capacitor, which applies the terminal voltage from the output terminal of the first loop filter (30-1), by a constant current from a third constant-current source, thereby decreasing the terminal voltage at the output terminal of the first loop filter (30-1), and charges the second capacitor, which applies the terminal voltage from the output terminal of the second loop filter (30-2), by a constant current from a fourth constant-current source, thereby increasing the terminal voltage at the output terminal of the second loop filter (30-2). In a data read-out apparatus for reproducing a signal from a recording disk, the PLL circuit according to this mode of the present invention outputs the read clock (RDCK), which has been synchronized to the input data, to a decoder or the like.

A PLL circuit according to the present invention is ideal for use in a clock synchronizing circuit for generating an internal clock, which is synchronized to an external clock, in a semiconductor integrated circuit or a clock-synchronized semiconductor storage device.

Embodiments of the present invention will now be described with reference to the drawings in order to explain further the modes of the invention set forth above.

FIG. 1 is a diagram illustrating the basic structure of an embodiment of a PLL circuit according to the present invention.

The PLL circuit according to this embodiment of the present invention is constituted by a loop comprising the phase comparator 10, the first and second loop filters 30-1, 30-2, the voltage-control led oscillator VCO 40 and the frequency divider 50. It should be noted that an arrangement may be adopted in which the output of the voltage-control led oscillator 40 is fed back and input to the phase comparator 10 without the intermediary of the frequency divider 50 (or with the intermediary of the frequency divider 50 the frequency dividing ratio of which is set to 1).

The voltage-control led oscillator 40 has a non-inverting input terminal (+) and an inverting input terminal (−). A difference voltage (signal) between terminal voltages applied to respective ones of the non-inverting and inverting input terminals (+), (−) is input to the voltage-control led oscillator 40 as a control voltage, and the voltage-control led oscillator 40 oscillates at a frequency conforming to this control voltage.

The first loop filter 30-1 and second loop filter 30-2 are connected at their output terminals to the non-inverting input terminal (+) and inverting input terminal (−), respectively, of the voltage-controlled oscillator 40.

In accordance with an UP signal from the phase comparator 10, the charge pump 20 charges a capacitor CA of the first loop filter 30-1, whose output terminal is connected to the non-inverting input terminal (+), and discharges the accumulated charge in a capacitor CB of the second loop filter 30-2, whose output terminal is connected to the inverting input terminal (−), thereby promptly enlarging the difference voltage between the terminal voltages of the non-inverting and inverting input terminals (+), (−) and raising the oscillation frequency of the voltage-controlled oscillator 40 to which this difference voltage is applied as the control voltage.

In accordance with a DOWN signal from the phase comparator 10, the charge pump 20 discharges the accumulated charge in the capacitor CA of the first loop filter 30-1, whose output terminal is connected to the non-inverting input terminal (+) and charges the capacitor CB of the second loop filter 30-2, whose output terminal is connected to the inverting input terminal (−), thereby promptly reducing the difference voltage between the non-inverting and inverting input terminals (+), (−) and lowering the oscillation frequency of the voltage-controlled oscillator 40 to which this difference voltage is applied as the control voltage.

The charge pump 20 includes a circuit (first circuit-module) 20-1 having first and second constant-current sources (not shown) which, in accordance with the UP signal from the phase comparator 10, supply a constant current P1 thereby charging the first capacitor CA connected to the non-inverting input terminal (+) and a constant current N1 thereby discharging electric charge that has accumulated in the second capacitor CB (the capacitance value of which is the same as that of capacitor CA) connected to the inverting input terminal (−); and a circuit (second circuit module) 20-2 having third and fourth constant-current sources (not shown) which, in accordance with the DOWN signal from the phase comparator 10, supply a constant current N2 thereby discharging electric charge that has accumulated in the first capacitor CA connected to the non-inverting input terminal (+) and a constant current P2 thereby charging the second capacitor CB connected to the inverting input terminal (−). In a case where the first and third constant-current sources are constituted by P-channel MOS transistors and the second and fourth constant-current sources are constituted by N-channel MOS transistors, the sum (P1+N1) of the charging current (P1) of the first capacitor CA and the discharge current N1 of the second capacitor CB and the sum (P2+N2) of the discharging current (N2) of the first capacitor CA and the charging current P2 of the second capacitor CB will be equal if P1 is equal to P2 and N1 is equal to N2. Thus, voltages proportional to the pulse widths of the UP and DOWN signals will be supplied to the non-inverting input terminal (+) and inverting input terminal (−) of the voltage-controlled oscillator, respectively, without being influenced by a difference in the current driving capabilities of the N-channel MOS transistor and P-channel MOS transistor caused by a difference (or deviation) in the element structures of these transistors.

FIG. 2 is a diagram illustrating the basic structure of a charge pump according to this embodiment of the present invention.

As shown in FIG. 2, the charge pump includes: a first constant-current source 101 connected to a high-potential power supply (VDD); a first switch 102 having one end connected to the output terminal of the first constant-current source 101 and having a control terminal connected to the UP signal output from the phase comparator 10; a first capacitor 105 having one end connected to the other end of the first switch 102 and to the non-inverting input terminal (+) of the voltage-controlled oscillator 40 and having its other end connected to a low-Potent ial power supply (GND); a second constant-current source 104 connected to the low-potential power supply (GND); a second switch 103 having one end connected to the output terminal of the second constant-current source 102 and having a control terminal connected to the UP signal output from the phase comparator 10; a second capacitor 110 having one end connected to the other end of the second switch 103 and to the inverting input terminal (−) of the voltage-control led oscillator 40 and having its other end connected to the low-potential power supply (GND); a third constant-current source 106 connected to the high-potential power supply (VDD); a third switch 107 having one end connected to the output terminal of the third constant-current source 106 and having a control terminal connected to the DOWN signal output from the phase comparator 10, the other end of the third switch 107 being connected to one end of the second capacitor 110; a fourth constant-current source 109 connected to the low-potential power supply (GND); a fourth switch 108 having one end connected to the output terminal of the fourth constant-current source 109 and having a control terminal connected to the UP signal output from the phase comparator 10, the other end of the fourth switch 108 being connected to the one end of the first capacitor 105.

When the UP signal output from the phase comparator 10 is in the active state, the first switch 102 having the UP signal applied to its control terminal turns on (conducts) and supplies the constant current (P1) from the first constant-current source 101 to the first capacitor 105 to charge the same and increase the terminal voltage of the first capacitor 105, and the second switch 103 having the UP signal applied to its control terminal also turns on to discharge the second capacitor 110 by the constant current (N1) from the second constant-current source 104 and decrease the terminal voltage of the second capacitor 110, thereby enlarging the difference voltage across the non-inverting input terminal (+) and inverting input terminal (−) of the voltage-control led oscillator 40. As a result, the output current of the voltage/current conversion circuit 41, to which the voltage across the non-inverting input terminal (+) and inverting input terminal (−) is applied as a differential, increases to thereby raise the oscillation frequency of the current-control led oscillator 42. The phase of the output signal (OUT) of the frequency divider 50 applied to the phase comparator 10 is therefore controlled so as to approach the phase of the input signal (IN).

When the DOWN signal output from the phase comparator 10 is in the active state, the third switch 107 having the DOWN signal applied to its control terminal turns on and supplies the constant current (P2) from the third constant-current source 106 to the second capacitor 110 to charge the same and increase the terminal voltage of the second capacitor 110, and the fourth switch 108 having the DOWN signal applied to its control terminal also turns on to discharge the first capacitor 105 by the constant current (N2) from the fourth constant-current source 109 and decrease the terminal voltage of the first capacitor 105, thereby decreasing the difference voltage across the non-inverting input terminal (+) and inverting input terminal (−) of the voltage-controlled oscillator 40. As a result, the output current of the voltage/current conversion circuit 41, to which the voltage across the non-inverting input terminal (+) and inverting input terminal (−) is applied as a differential, decreases to thereby lower the oscillation frequency of the current-controlled oscillator 42. The phase of the output signal of the frequency divider 50 applied to the phase comparator 10 is therefore controlled so as to lag the phase of the input signal (IN). This is in contrast to the case with the UP signal.

Figure 3A:
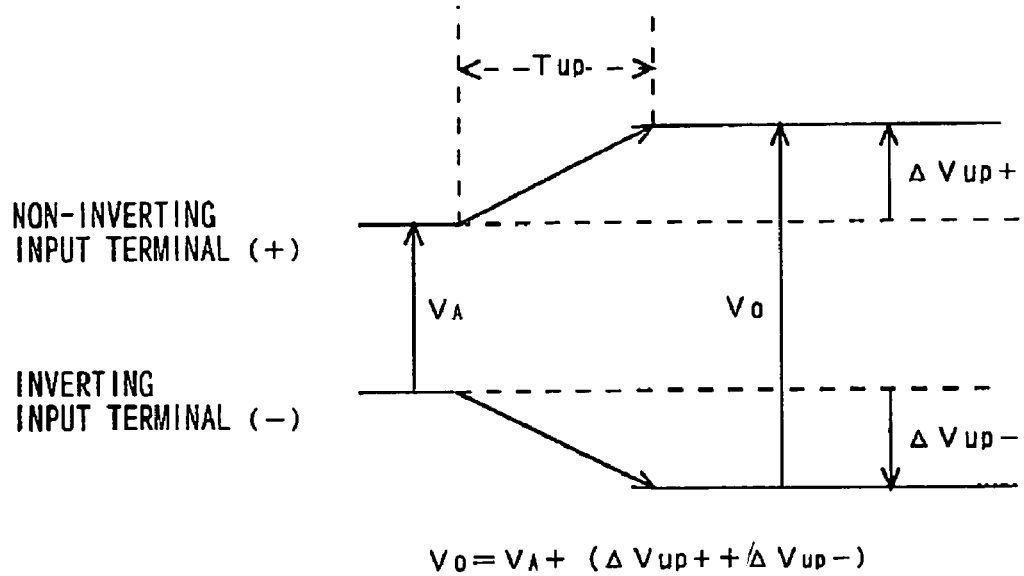
FIGS. 3A and 3B are diagrams useful in describing the operation of this embodiment and illustrate the manner in which terminal voltages applied to non-inverting and inverting input terminals vary at the time of UP and DOWN operations.
Figure 3B:
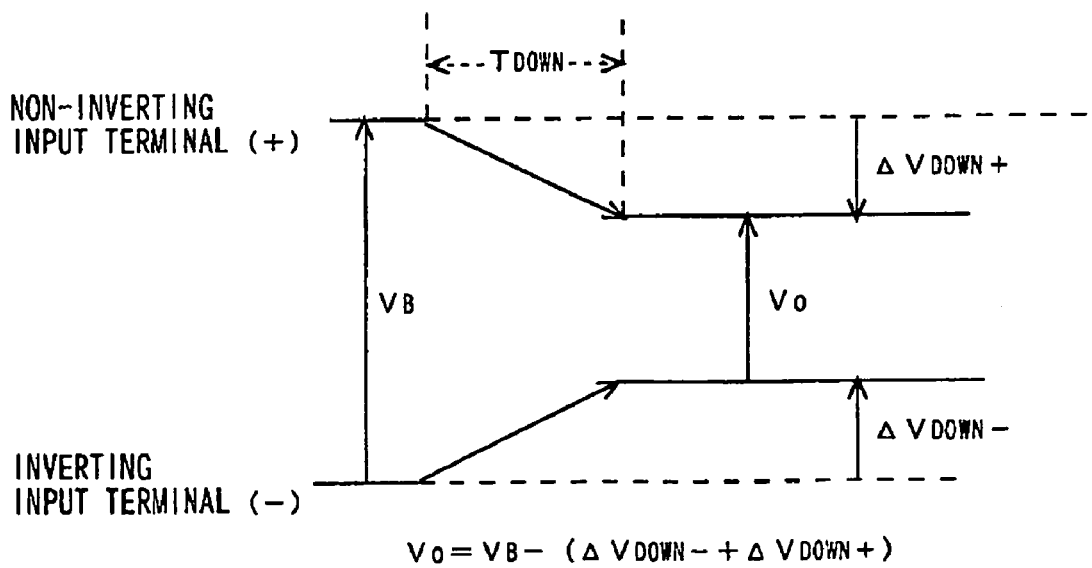

FIGS. 3A and 3B are diagrams illustrating the variation in the terminal voltage of the non-inverting input terminal (+) (the terminal voltage of the first capacitor 105) and in the terminal voltage of the inverting input terminal (−) (the terminal voltage of the second capacitor 110) of the voltage-controlled oscillator 40 when the UP signal is active and when the DOWN signal is active, respectively. Let C represent the capacitance of the first capacitor 105 and of the second capacitor 110.

During the time that the UP signal output from the phase comparator 10 is active, as shown in FIG. 3A, the terminal voltage of the non-inverting input terminal (+) of voltage-controlled oscillator 40 rises by an amount $\Delta V_{UP+} = (P1 \times T_{UP})/C$ obtained by dividing, by the capacitance value C, the electric charge ($Q = P1 \times T_{UP}$) caused to accumulate in the first capacitor (C) 105 over the UP-signal active period ($T_{UP}$) by the current (P1). At the same time, the terminal voltage of the inverting input terminal (−) of voltage-controlled oscillator 40 falls by an amount $\Delta V_{UP-} = (N1 \times T_{UP})/C$ obtained by dividing, by the capacitance value C, the electric charge ($Q = N1 \times T_{UP}$) that is discharged from the second capacitor (C) 110 over the UP-signal active period ($T_{UP}$) by the current (N1). As a result, a difference potential $V_0$ between the terminal voltages of the non-inverting input terminal (+) and inverting input terminal (−) of voltage-controlled oscillator 40 is enlarged from the original difference potential $V_A$ by $$\Delta V_1 = \Delta V_{UP+} + \Delta V_{UP-}$$

$$= \{(P1 \times T_{UP}) + (N1 \times T_{UP})\}/C$$

and thus becomes $V_A + \Delta V_1$.

During the time that the DOWN signal output from the phase comparator 10 is active, as shown in FIG. 3B, the terminal voltage of the non-inverting input terminal (+) of voltage-controlled oscillator 40 falls by an amount $\Delta V_{DOWN-} = (N2 \times T_{DOWN})/C$ obtained by dividing, by the capacitance value C, the electric charge ($Q = N2 \times T_{DOWN}$) that is discharged from the first capacitor (C) 105 over the DOWN-signal active period ($T_{DOWN}$) by the current (N2). At the same time, the terminal voltage of the inverting input terminal (−) of voltage-controlled oscillator 40 rises by an amount $\Delta V_{DOWN+} = (P2 \times T_{DOWN})/C$ obtained by dividing, by the capacitance value C, the electric charge ($Q = P2 \times T_{DOWN}$) caused to accumulate in the second capacitor (C) 110 over the DOWN-signal active period ($T_{DOWN}$) by the current (P2). As a result, a difference potential $V_B$ between the terminal voltages of the non-inverting input terminal (+) and inverting input terminal (−) of voltage-controlled oscillator 40 is reduced from the original difference potential $V_0$ by $$\Delta V_2 = \Delta V_{DOWN-} + \Delta V_{DOWN+}$$

$$= \{(N2 \times T_{DOWN}) + (P2 \times T_{DOWN})\}/C$$

Thus, the terminal voltages of the first and second capacitors 105, 110 vary in dependence upon the UP and DOWN signals output from the phase comparator 10 and, as a result, the phase of the output signal of the frequency divider 50 and the phase of the input signal are synchronized.

For example, in a case where the UP and DOWN signals are output from the phase comparator 10, as shown in FIG. 3, the difference potential $\Delta V$ between the terminal voltages of the non-inverting input terminal (+) and inverting input terminal (−) of the voltage-controlled oscillator 40 when the UP signal is applied for the period $T_{UP}$ and then the DOWN signal is applied for the period $T_{DOWN}$ assumes as follows:

$$\Delta V = (V_A + \Delta V_1) - (\Delta V_2)$$

$$= V_A + \Delta V_1 - \Delta V_2$$

$$= V_A + \{(P1 \times T_{UP}) + (N1 \times T_{UP})\}/C$$

$$- \{(N2 \times T_{DOWN}) + (P2 \times T_{DOWN})\}/C$$

When the phase comparator 10 detects that the input signal and the output signal that is obtained from the frequency divider 50 are in phase and the pulse widths of the UP and DOWN signals become equal ($T_{UP} = T_{DOWN} = T$), the difference potential $\Delta V$ between the terminal voltages of the non-inverting input terminal (+) and inverting input terminal (−) of the voltage-controlled oscillator 40 becomes $$\Delta V = V_A + \{(P1 - P2) \times T) + (N1 - N2) \times T\}/C.$$

Accordingly, at the moment the UP and DOWN signals of identical pulse widths are output from the phase comparator 10 in a case where P1=P2, N1=N2 holds, the difference potential between the terminal voltages of the non-inverting input terminal (+) and inverting input terminal (−) of the voltage-controlled oscillator 40 is held at a voltage value the same as that of the original difference potential $V_A$ that prevailed prior to the output of the UP and DOWN signals from the phase comparator 10. The locking state of the phases is thus maintained.

The voltage-controlled oscillator 40 includes the voltage/current conversion circuit 41 and the current-controlled oscillator 42. The voltage/current conversion circuit 41, which has the terminal voltage of the first capacitor 105 of first loop filter 30-1 input to its non-inverting input terminal (+) and the terminal voltage of the second capacitor 110 of second loop filter 30-2 input to its inverting input terminal (−) outputs a current that corresponds to the difference voltage. The current-controlled oscillator 42, to which the output current of the voltage/current conversion circuit 41 is input as the control current, oscillates at a frequency conforming to this control current.

FIG. 4 is a diagram illustrating an example of the circuit structure of a charge pump 20 in a PLL circuit according to an embodiment of the present invention.

As shown in FIG. 4, the charge pump 20 has P-channel MOS transistors PM1, PM2 and PM3 the sources of which are connected to the high-potential power supply (VDD). The gate and drain of the P-channel MOS transistor PM2 are connected together and are further connected to the gate of the P-channel MOS transistor PM3, the UP signal from the phase comparator 10 is input to the gate of the P-channel MOS transistor PM1 and the drain of the P-channel MOS transistor PM1 is connected to the commonly connected gates of the P-channel MOS transistors PM2 and PM3.

The charge pump 20 further has N-channel MOS transistors NM1, NM2 and NM3 the sources of which are connected to the low-potential power supply (GND). The gate and drain of the N-channel MOS transistor NM2 are connected together and are further connected to the gate of the N-channel MOS transistor NM3, a signal obtained by inverting the UP signal from the phase comparator 10 by an inverter INV1 is input to the gate of the N-channel MOS transistor NM1 and the drain of the N-channel MOS transistor NM1 is connected to the commonly connected gates of the N-channel MOS transistors NM2 and NM3. The drain of the P-channel MOS transistor PM2 is connected to the output terminal of the first constant-current source 21 whose one end is connected to the low-potential power supply (GND), the drain of the N-channel MOS transistor NM2 is connected to the output terminal of the first constant-current source 22 whose one end is connected to the high-potential power supply (VDD), and the drains of the P-channel MOS transistor PM3 and N-channel MOS transistor NM3 are connected to the input terminals of the loop filters 30-1 and 30-2, respectively.

The P-channel MOS transistors PM2, PM3 construct the first current mirror circuit 23 and the N-channel MOS transistors NM2, NM3 construct the second current mirror circuit 24. When the P-channel MOS transistor PM1 is off (i.e., when the UP signal output from the phase comparator 10 is at the high level), the first current mirror circuit 23 reflects the current value of the first constant-current source 21 supplied to the drain of the P-channel MOS transistor PM2 forming the input terminal of the current mirror circuit, and the current is output from the drain of the P-channel MOS transistor PM3, which forms the output terminal, to thereby charge the capacitor of the first loop filter 30-1.

When the N-channel MOS transistor NM1 is off (i.e., when the UP signal output from the phase comparator 10 is at the high level), the second current mirror circuit 24 reflects the current value of the second constant-current source 22 supplied to the drain of the N-channel MOS transistor NM2 forming the input terminal of the current mirror circuit, and the current is output from the drain of the N-channel MOS transistor NM3, which forms the output terminal, to thereby discharge the capacitor of the second loop filter 30-2.

The charge pump 20 further includes P-channel MOS transistors PM4, PM5 and PM6 the sources of which are connected to the high-potential power supply (VDD). The gate and drain of the P-channel MOS transistor PM5 are connected together and are further connected to the gate of the P-channel MOS transistor PM6, the DOWN signal from the phase comparator 10 is input to the gate of the P-channel MOS transistor PM4 and the drain of the P-channel MOS transistor PM4 is connected to the commonly connected gates of the P-channel MOS transistors PM5 and PM6. The charge pump 20 further includes N-channel MOS transistors NM4, NM5 and NM6 the sources of which are connected to the low-potential power supply (GND). The gate and drain of the N-channel MOS transistor NM5 are connected together and are further connected to the gate of the N-channel MOS transistor NM6, a signal obtained by inverting the DOWN signal from the phase comparator 10 by an inverter INV2 is input to the gate of the N-channel MOS transistor NM4 and the drain of the N-channel MOS transistor NM4 is connected to the commonly connected gates of the N-channel MOS transistors NM5 and NM6.

The drain of the P-channel MOS transistor PM4 is connected to the output terminal of the first constant-current source 25 one end of which is connected to the low-potential power supply (GND), and the drain of the N-channel MOS transistor NM4 is connected to the output terminal of the second constant-current source 26 one end of which is connected to the high-potential power supply (VDD). The drain of the P-channel MOS transistor PM6 and the drain of the N-channel MOS transistor NM6 are connected to the input terminals of the second and first loop filters 30-2 and 30-1, respectively.

The P-channel MOS transistors PM5, PM6 construct the third current mirror circuit 27 and the N-channel MOS transistors NM5, NM6 construct the fourth current mirror circuit 28. When the P-channel MOS transistor PM4 is off (i.e., when the DOWN signal output from the phase comparator 10 is at the high level), the third current mirror circuit 27 reflects the current value of the third constant-current source 25 supplied to the drain of the P-channel MOS transistor PM5 forming the input terminal of this current mirror circuit, and the current is output from the drain of the P-channel MOS transistor PM6, which forms the output terminal, to thereby charge the capacitor of the second loop filter 30-2. When the N-channel MOS transistor NM4 is off (i.e., when the DOWN signal is at the high level), the fourth current mirror circuit 28 reflects the current value of the fourth constant-current source 26 supplied to the drain of the N-channel MOS transistor NM5 forming the input terminal of the current mirror circuit, and the current is output from the drain of the N-channel MOS transistor NM6, which forms the output terminal, to thereby discharge the capacitor of the first loop filter 30-1.

The first loop filters 30-1, 30-2 each include a capacitor (capacitor) $C_0$ charged and discharged by the charge pump 20 and the terminal voltage of which forms the output terminal voltage of the loop filter. In the present invention, the circuit arrangement of the loop filters naturally is not limited to that shown in FIG. 4. Further, in this embodiment of the invention, a capacitor (C1, C2) within each loop filter is arranged (via a resistor R) to be charged and discharged by the charge pump. However, it is of course permissible to adopt an arrangement in which first and second capacitors (see capacitors 105 and 110 in FIG. 2) charged and discharged by the charge pump 20 are provided, and first and second loop filters having a desired low-pass characteristic (cut-off frequency) are provided between the terminals of these first and second capacitors and the non-inverting and inverting input terminals (+), (−), respectively, of the voltage-controlled oscillator 40.

In response to the active interval (the high-level interval) of the UP signal output from the phase comparator 10, the current from the first constant-current source 21 is mirror-reflected by the first current mirror circuit 23 so that the output current (P1) from the P-channel MOS transistor PM3 is supplied to (charged in) the capacitor of the first loop filter 30-1 the output terminal of which is connected to the non-inverting input terminal (+) of the voltage-controlled oscillator 40, and the current from the second constant-current source 22 is mirror-reflected by the second current mirror circuit 24 so that a current is expel led (discharged)

from the second loop filter 30-2, the output terminal of which is connected to the inverting input terminal (−) of the voltage-controlled oscillator 40, by the output current (N1) of the N-channel MOS transistor NM3.

On the other hand, in response to the active interval (the high-level interval) of the DOWN signal output from the phase comparator 10, the current from the third constant-current source 25 is reflected by the third current mirror circuit 27 so that the output current (P2) from the P-channel MOS transistor PM6 is supplied to (charged in) the capacitor of the second loop filter 30-2 the output terminal of which is connected to the inverting input terminal (−) of the voltage-controlled oscillator 40, and the current from the fourth constant-current source 26 is reflected by the fourth current mirror circuit 28 so that a current is expel led (discharged) from the first loop filter 30-1, the output terminal of which is connected to the non-inverting input terminal (+) of the voltage-controlled oscillator 40, by the output current (N2) of the N-channel MOS transistor NM6.

When current is supplied to the capacitor of the first loop filter 30-1, which provides the terminal voltage to the non-inverting input terminal (+) of the voltage-controlled oscillator 40, by the output current (P1) from the P-channel MOS transistor PM3 in the first current mirror circuit 23 of charge pump 20, the oscillation frequency of the voltage-controlled oscillator 40 rises to establish the UP operation (referred to as "UP operation A").

When the capacitor of the second loop filter 30-2, which provides the terminal voltage to the inverting input terminal (−) of the voltage-control led oscillator VCO 40, is charged by the output current (P2) from the P-channel MOS transistor PM6 in the third current mirror circuit 27 of the charge pump 20, the terminal voltage of the inverting input terminal (−) of VCO 40 rises, and the oscillation frequency of the voltage-control led oscillator 40 falls to establish the DOWN operation (referred to as "DOWN operation A").

When the capacitor of the first loop filter 30-1, which provides the terminal voltage to the non-inverting input terminal (+) of the voltage-controlled oscillator 40, is discharged by the output current (N2) from the N-channel MOS transistor NM6 in the fourth current mirror circuit 28 of the charge pump 20, the oscillation frequency of the voltage-controlled oscillator 40 falls to establish a DOWN operation (referred to as "DOWN operation B").

When the capacitor of the second loop filter 30-2, which provides the terminal voltage to the inverting input terminal (−) of the voltage-control led oscillator 40, is discharged by the output current (N1) from the N-channel MOS transistor NM3 in the second current mirror circuit 24 of the charge pump 20, an UP operation is established (referred to as "UP operation B").

At the time of the UP operation, the P-channel MOS transistor PM3 (UP operation A) and the N-channel MOS transistor NM3 (UP operation B) operate, and at the time of the DOWN operation, the P-channel MOS transistor PM6 (DOWN operation A) and the N-channel MOS transistor NM3 (DOWN operation B) operate.

With regard to the current P1 of the P-channel MOS transistor PM3 that flows in the UP operation A, the current N1 of the N-channel MOS transistor NM3 that flows in the UP operation B, the current P2 of the P-channel MOS transistor PM6 that flows in the DOWN operation A and the current N2 of the N-channel MOS transistor NM6 that flows in the DOWN operation B, the ratio of the current at the time of the UP operation to the current at the time of the DOWN operation is (P1+N1):(P2+N2).

In the charge pump used in the conventional PLL circuit, a design was required and sought that would establish 1:1 as the ratio of the current value at the time of the UP operation to the current value at the time of the DOWN operation, as mentioned earlier. By contrast, the PLL circuit according to this embodiment of the present invention is equipped with a voltage-controlled oscillator having a differential input, whereby the current ratio between the UP and DOWN operations is decided by (P1+N1) (P2+N2). As a result, even if P:N is not equal to 1:1, the current ratio between the UP and DOWN operations will be 1:1 so long as the output currents (P1 and P2) of the N-channel MOS transistors PM3 and PM6 are equal and the output currents (N1 and N2) of the P-channel MOS transistors NM3 and NM6 are equal. A PLL circuit that is strongly resistant to variations in manufacture is thus realized and it is unnecessary to mount a correction circuit which corrects for variations in manufacture. An adjustment operation after manufacture also is unnecessary.

The output signal of the voltage-control led oscillator VCO 40 is frequency-divided by the frequency divider 50 to obtain a read clock or an output clock, and the clock obtained is compared with the input clock in the phase comparator to thereby generate the UP and DOWN signals.

Figure 5:
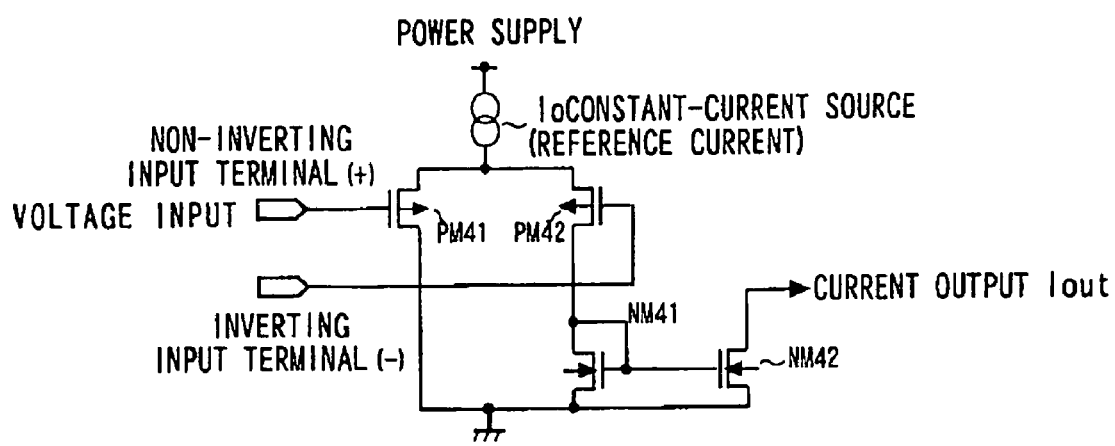
FIG. 5 is a diagram illustrating the structure of a voltage/current conversion circuit according to this embodiment of the present invention.

FIG. 5 is a diagram illustrating an example of the structure of the voltage/current conversion circuit 41 according to this embodiment of the present invention.

Figure 13A:
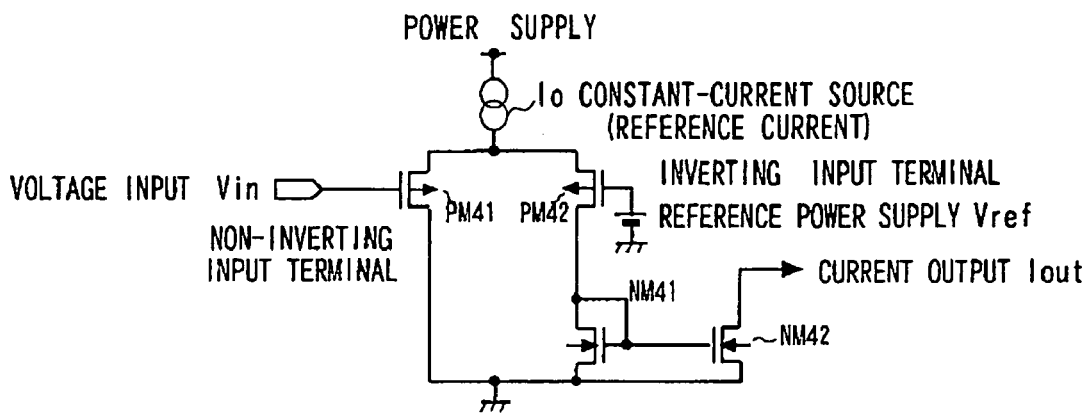
FIG. 13A is a diagram illustrating the structure of a voltage-control led oscillator in a PLL circuit according to the prior art, FIG. 13B a diagram of a current-control led oscillator and FIG. 13C a diagram showing an example of an inverter which constructs a ring oscillator.
Figure 13B:
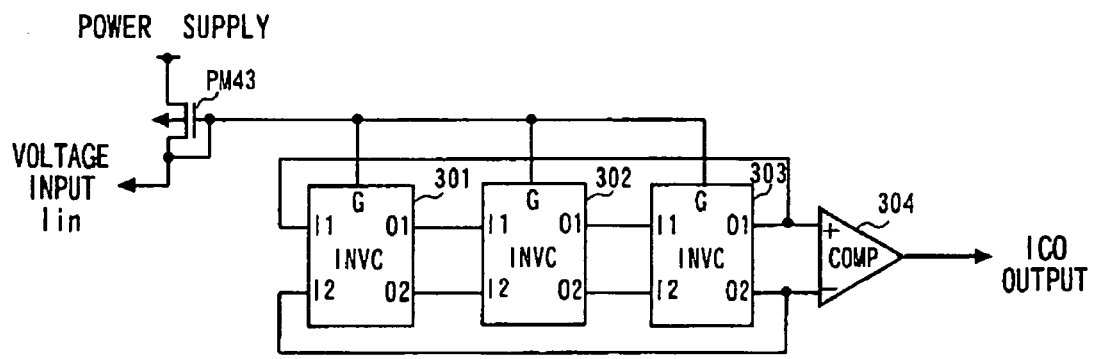
Figure 13C:
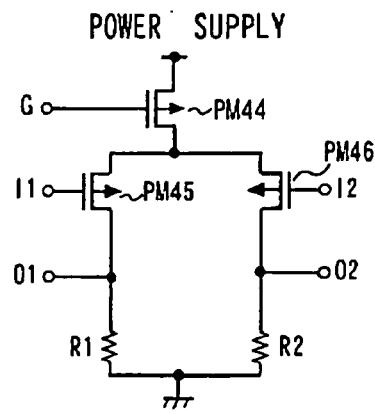
Figure 14A:
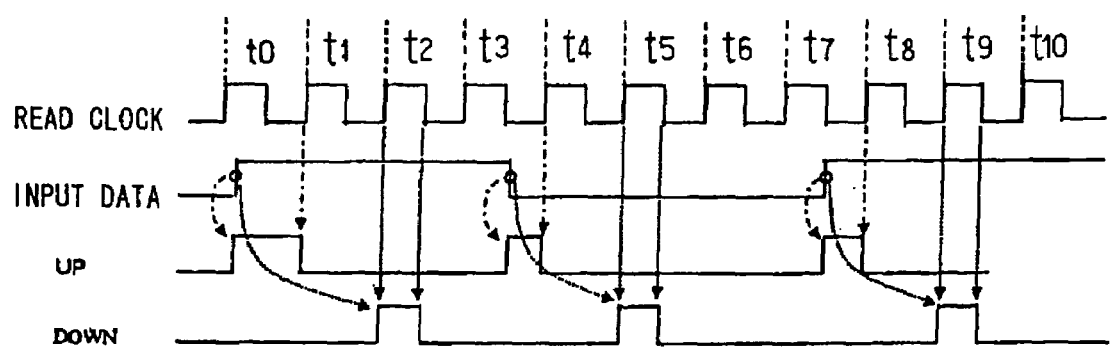
FIGS. 14A and 14B are timing diagrams illustrating an input signal to a phase comparator and UP and DOWN signals from the phase converter.
Figure 14B:
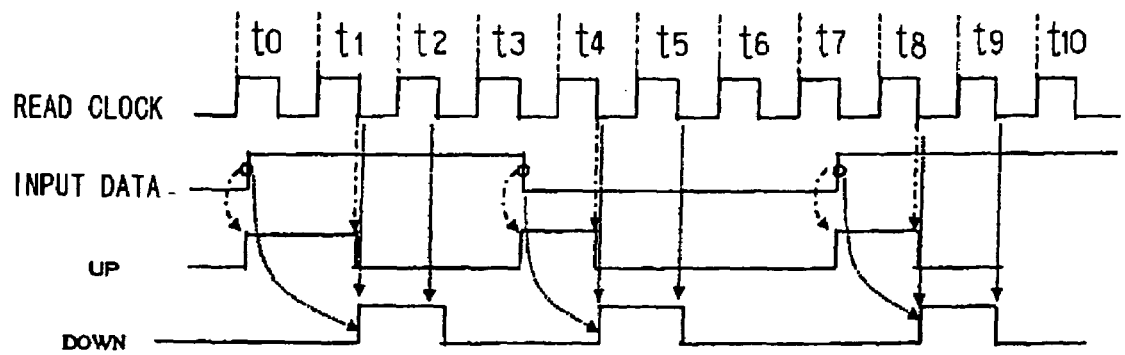

As shown in FIG. 5, the voltage/current conversion circuit 41 includes P-channel MOS transistors PM41 and PM42, the sources of which are connected in common and connected also to a constant-current source $I_0$ that supplies a reference current, and to the gates of which are input the output voltage of the first loop filter (LPF) 30-1 whose input arrives from the non-inverting input terminal (+) and the output voltage of the second loop filter (LPF) 30-2 whose input arrives from the inverting input terminal (−), respectively. The drain of the P-channel MOS transistor PM41 is connected to the low-potential power supply (GND), the drain of the P-channel MOS transistor PM42 is connected to the drain of an N-channel MOS transistor NM41 whose source is connected to GND potential and whose drain and gate are connected together, and a current is output from the drain of an N-channel MOS transistor NM42 whose gate is connected to the gate of the N-channel MOS transistor NM41 and whose source is connected to GND potential. The N-channel MOS transistors NM41 and NM42 construct a current mirror circuit. A drain current corresponding to a difference voltage ΔV across the non-inverting input terminal (+) and inverting input terminal (−) is output from the P-channel MOS transistor PM42 and applied to an input terminal of the current mirror circuit. The mirror current is output from the drain of the N-channel MOS transistor NM42, which forms an output terminal of the current mirror, as a control current Iout for the current-controlled oscillator. In this embodiment, the current-controlled oscillator may be of any known type. For example, a current-control led oscillator having a structure described above in connection with FIG. 13 may be used, if necessary, with adaptive revision in compliance with the present invention. Of course, there is no limitation upon the number of stages of the ring oscillator in the current-control led oscillator shown in FIG. 13. Further, in the present invention, it goes without saying that the current/voltage conversion circuit may be constituted by N-channel MOS transistors in place of P-channel MOS transistors used, e.g., in FIG. 5.

The specification of Japanese Patent Kokai Publication JP-A-11-186904 discloses the structure of a voltage-control led oscillator having two terminals to which the terminal voltages of two capacitors C1 and C2 are applied. However, both terminals are non-inverting input terminals and therefore the disclosed voltage-controlled oscillator is not one having a differential input equipped with a non-inverting input terminal and an inverting input terminal. In other words, in the PLL circuit described in the specification of Japanese Patent Kokai Publication JP-A-11-186904, the ratio of "the output current of the charge pump at the time of the UP operation" to "the output current of the charge pump at the time of the DOWN operation" is the ratio of the output current of the P-channel MOS transistor to the output current of the N-channel MOS transistor in the same manner as in the PLL circuit of the prior art.

In other embodiments, the PLL circuit according to further aspects of the present invention is ideal for use in the PLL circuit of a data read-out apparatus for reading various recording media, examples of which are a CD-ROM, DVD-ROM, DVD-RW (read/write), a CD-RW and a CD-R (write once).

In an apparatus for reproducing data from a recording disk on which information has been recorded by a digital recording system, a PLL circuit is used in order to synchronize the data and a data read clock when the data recorded on the recording disk is read using the data read clock, which serves as a playback clock.

Figure 7:
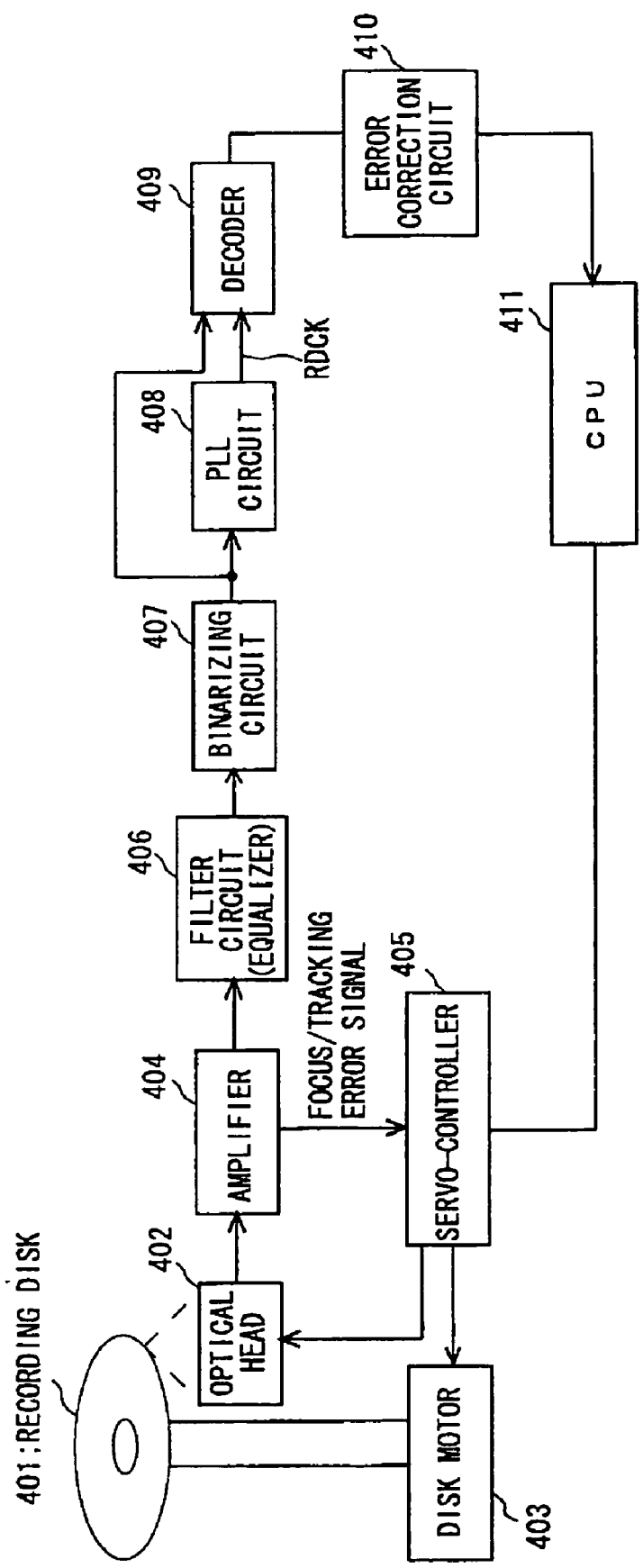
FIG. 7 is a block diagram illustrating the structure of a data read-out apparatus to which the PLL circuit of the present invention is applied.

FIG. 7 is a block diagram illustrating the structure of a data read-out apparatus (playback apparatus) to which the PLL circuit of the present invention is applied.

As shown in FIG. 7, the apparatus includes an optical head 402 reading data from a recording disk 401; an amplifier (preamp) 404 generating a playback RF signal, a focus error signal and a tracking error signal from the data read from the optical head 402; a filter (equalizer) 406 for eliminating noise from and wave-form equalizing the playback RF signal from the amplifier 404; a binarizing circuit 407 binarizing the playback RF signal to "1" s and "0"s; a PLL circuit 408 for generating a clock (RDCK) (referred to as a "read clock signal" or "data clock") synchronized to the binarized data; a decoder (demodulation circuit) 409 decoding data; an error correction circuit 410 subjecting the reproduced data to error correction; a CPU 411 for overall control of the apparatus; a disk motor 403 for rotating the recording disk 401; and a servo-controller 405 controlling the optical head 402 and the disk motor 403.

FIG. 8 is a block diagram illustrating the structure of the PLL circuit 408 used in the data read-out apparatus shown in FIG. 7.

As shown in FIG. 8, the PLL circuit according to this embodiment of the present invention includes: the current-controlled oscillator (ICO) 42 generating and outputting a clock signal having a frequency conforming to an entered control current; the frequency divider 50 frequency-dividing the clock signal from the current-controlled oscillator 42; the phase comparator 10, to which an input signal (EFM) and a clock signal (RDCK) that is output from the frequency divider 50 are input, for outputting an UP signal and a DOWN signal in conformity with phase lag and lead of the clock signal relative to the input signal; the first charge pump 20 producing an output voltage by charging and discharging a capacitor based upon the UP and DOWN signals output from the phase comparator 10; the frequency comparator 60, to which the input signal (EFM) and the clock signal that is output from the frequency divider 50 are input, for detecting a frequency error by measuring a synchronization pattern of the input signal (EFM) using the clock signal (RDCK) output from the frequency divider 50; the second charge pump 70 outputting an error voltage that conforms to the frequency error; first and second loop filters 30-1, 30-2 to which an output voltage of the first charge pump 20 is input; a loop filter 80 to which an output voltage of the second charge pump 70 is input; a first voltage/current conversion circuit 41a having a non-inverting input terminal (+) and an inverting input terminal (−) from which is input a differential voltage between the output voltages from the first and second loop filters 30-1 and 30-2, respectively, for effecting a conversion to current that corresponds to the difference voltage; and a second voltage/current conversion circuit 41b converting an output voltage of the second loop filter 80 to current; wherein a sum current obtained by summing a current output from the first voltage/current conversion circuit 41a and a current output from the second voltage/current conversion circuit 41b using a combiner (adder) 90 is input to the current-controlled oscillator (ICO) 42 as a control current.

The output terminals of the first and second loop filters 30-1 and 30-2 are connected to the non-inverting and inverting input terminals (+), (−), respectively, of the voltage/current conversion circuit (V/I converter) 41a. The structures of the charge pump 20 and first and second loop filters 30-1 and 30-2 are similar to those described earlier with reference to FIG. 2 or 4.

More specifically, when the UP signal output from the phase comparator 10 is in the active state, the charge pump 20 charges the first capacitor (105 in FIG. 2), which applies the terminal voltage of the output terminal of the first loop filter 30-1, by a constant current output from a first constant-current source, thereby increasing the terminal voltage at the output terminal of the first loop filter 30-1, and discharges a second capacitor (110 in FIG. 2), which applies the terminal voltage of the output terminal of the second loop filter 30-2), by a constant current from a second constant-current source, thereby decreasing the terminal voltage at the output terminal of the second loop filter 30-2. When the DOWN signal output from the phase comparator 10 is in an active state, the charge pump 20 discharges the first capacitor (105 in FIG. 2, which applies the terminal voltage of the output terminal of the first loop filter 30-1, by a constant current from a third constant-current source, thereby decreasing the terminal voltage at the output terminal of the first loop filter 30-1, and charges the second capacitor (110 in FIG. 2), which applies the terminal voltage of the output terminal of the second loop filter 30-2, by a constant current from a fourth constant-current source, thereby increasing the terminal voltage at the output terminal of the second loop filter 30-2.

Figure 9A:
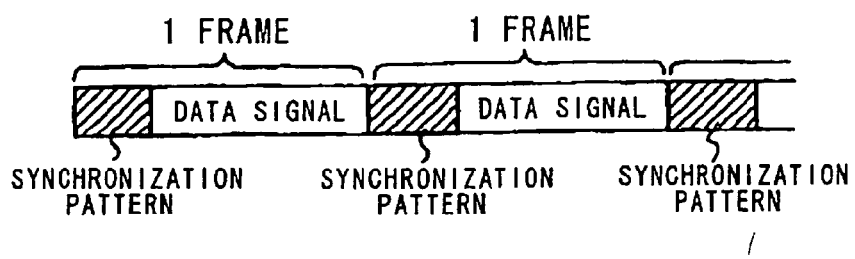
FIG. 9A is a diagram schematically illustrating synchronization patterns, FIG. 9B a diagram useful in describing the synchronization pattern of an EFM signal and FIG. 9C a diagram useful in describing a synchronization pattern of an EFM plus signal.

In order to exercise control so as to synchronize data recorded on a recording disk with a data read clock, a synchronization pattern is provided for every frame, as shown in FIG. 9A. In the case of a CD-ROM, an EFM (Eight-to-Fourteen Modulation) signal system is used, and in the case of a DVD (Digital Versatile Disk), an EFMplus code is used.

Figure 9B:
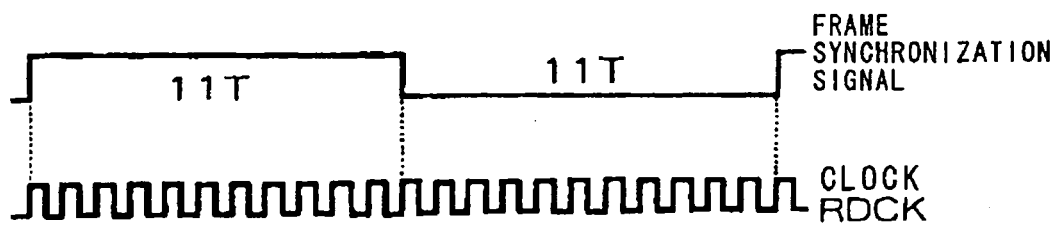

In the EFM signal system, the synchronization pattern is a signal composed of two successive maximum inverted intervals (11T, where T represents the channel bit length), as shown in FIG. 9B. The data signal is not more than "11T" owing to the bit length and bit intervals of the recording disk. The length from a rising edge of the signal to the next rising edge or from a falling edge of the signal to the next falling edge is measured using the data read clock. If the measured value is "22", then it is judged that the signal is the synchronization pattern. (Reference is made to JP-A-59-172180, the disclosure thereof being incorporated herein by reference thereto.)

In the EFM plus system, on the other hand, the synchronization pattern is a signal having inverted intervals of 14T and 4T. There is a possibility of inclusion of a data signal composed of, e.g., nine successive "1"s and nine successive "0"s, for a total of 9T+9T, or of ten successive "1"s and eight successive "0"s, for a total of 10T+8T, in one period (18T) of the synchronization pattern. Therefore, even if the length from the rising edge of the signal to the next rising edge or from the falling edge of the signal to the next falling edge is measured using the data read clock and the measured value is found to be "18", it cannot be judged immediately that the signal is a synchronization pattern. Accordingly, the length of the signal is measured from a rising edge to the next falling edge or from a falling edge to the next rising edge using the data read clock. If the measured value is "14", then the length of the signal is measured further up to the following rising edge or falling edge of the signal using the data read clock, and a frequency error is detected based upon the result of this measurement. The EFM plus signal is measured from its rising edge to its falling edge or from its falling edge to its rising edge using the data read clock. If the measured value is other than "14", pulse signals having pulse widths that differ from each other based upon the measured value are output as the frequency error signal. On the other hand, if the measured value is "14", the signal is measured up to the following rising edge or falling edge using the data read signal, and pulse signals having pulse widths that differ from each other based upon the result of measurement are output as the frequency error signal. The output frequency error signal is converted to voltage by the second charge pump 70, a control current is supplied to the current-control led oscillator 42 via the second low-pass filter 80, second voltage/current converter 41b and current adder 90, and the current-control led oscillator 42 outputs a signal having the prescribed frequency.

Upon measuring the EFM pulse signal from its rising edge to its falling edge or from its falling edge to its rising edge, in a case where the measured value is "14" and the measured value up to following rising edge or falling edge of the signal is "4", a center value of the frequency error signal is output, which represents the state where the frequencies of the data read clock and EFM plus signal are synchronized.

Figure 9C:
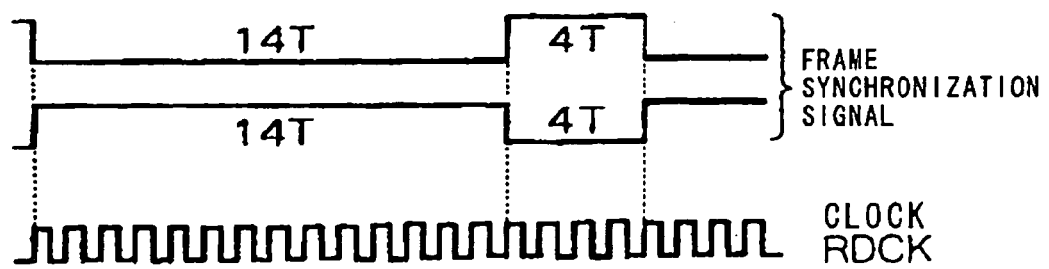
Figure 10:
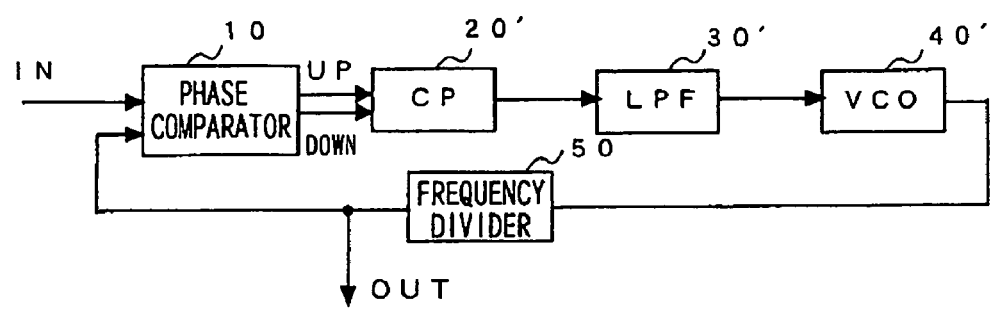
FIG. 10 is a block diagram illustrating the structure of a PLL circuit according to the prior art.
Figure 11:
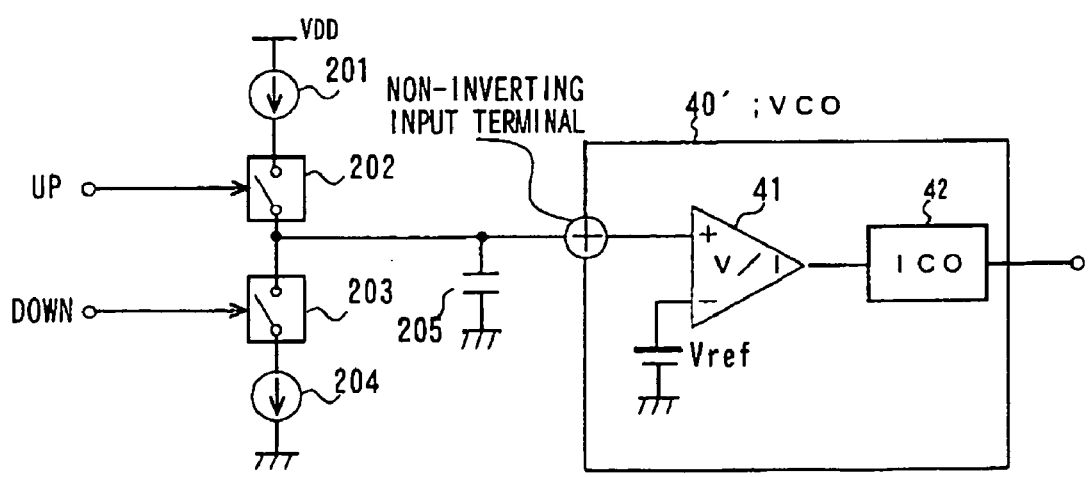
FIG. 11 is a diagram useful in describing the structure of a charge pump of a PLL circuit according to the prior art.

After the center value of the frequency error signal is output and the frequencies of the data read clock and EFM plus signal are synchronized, phase error is detected by comparing the edges of the data read clock and EFM plus signal in the phase comparator 10 using the output current value of the second voltage/current conversion circuit 41b as an offset current, and a pull-in operation (i.e., approaching) is performed so as to synchronize (lock) the phases of the data read clock and EFM plus signal by the loop constituted by the charge pump 20, the first and second loop filters 30-1, 30-2, the voltage/current conversion circuit 41a, the current adder 90, the current-controlled oscillator 42 and the frequency divider 50. The frequency-divided value of the frequency divider 50 at this time is fixed to a value which prevails at the time of frequency synchronization. For the details of FIGS. 7 and 9 and of the frequency comparator, etc., see the description in the specification of Japanese Patent Application No. 10-188856 (now JP-P2000-22526A), which is a patent application filed by the assignee of the present invention. The entire disclosure of JP-P2000-22526A is incorporated herein by reference thereto.

The current adder 90 adds an output current of the phase synchronizing path (A) and an output of the frequency synchronizing path (B). In the phase synchronizing path (A), the output representing the result of the phase comparison from the phase comparator 10 whose inputs are the EFM signal (or the EFM plus signal) and the data read clock (RDCK) is output as a voltage by the first charge pump 20, the high-frequency components are cut by the first and second loop filters 30-1, 30-2, and the differential output between the first and second loop filters 30-1, 30-2 is converted to current by the first voltage/current conversion circuit 41a. In the frequency synchronizing path (B), output current of the phase synchronizing path the output voltage of the second charge pump 70 that receives the output of the frequency comparator 60 whose inputs are the EFM signal and data read clock (RDCK) is input to the low-pass filter (LPF) 80 and the output voltage of the low-pass filter 80 is converted to current by the second voltage/current conversion circuit 41b. Then, the sum of these currents of the two paths (A) and (B) is input to the current-control led oscillator (ICO) 42 as a control current, the output of the current-control led oscillator 42 is input to the frequency divider 50, and the output of the frequency divider 50 is input to the phase comparator 10 and frequency comparator 60 as the data read clock (RDCK).

At the start of operation, the phase comparator 10, first charge pump 20 and the first and second low-pass filters 30-1, 30-2 are in the standby state. Frequency synchronizing control is carried out in such a manner that frequency is synchronized by the loop composed of the frequency comparator 60, second charge pump 70, low-pass filter 80, second voltage/current conversion circuit 41b, current-controlled oscillator (ICO) 42 and frequency divider 50. At this time the frequency-divided value of the frequency divider 50 is set to a prescribed value, which conforms to the clock speed of the data rate (1×, 2×, etc.), by software run by the CPU (see FIG. 7).

At the moment frequency is synchronized, the output current of the second voltage/current conversion circuit (V/I converter) 41b is fixed at a constant value, an offset current is supplied, and phase synchronizing control is carried out in such a manner that phase is synchronized by the loop composed of phase comparator 10, first charge pump 20, first and second low-pass filters 30-1, 30-2, voltage/current conversion circuit 41a, current-controlled oscillator (ICO) 42 and frequency divider 50.

Further, in a semiconductor integrated circuit device and clock-synchronized semiconductor storage device, the PLL circuit of the present invention is ideal for use in a clock synchronizing circuit, to which an external clock is input from an input buffer, for generating an internal clock whose phase in synchronized to the external clock and for supplying the generated clock to an internal circuit.

The charge pump of the present invention can be used not only in the PLL circuit, but in any desired circuit in which charging and discharging of a capacitor(s) (or condenser(s)) are controlled in accordance with the control signal.

Further, the description has been given on the PLL circuit which is primarily based on MOS transistors. However, the charge pump of the present invention can be applied also to the PLL circuit based on other types of transistors e.g., bipolar (PNP and/or NPN) transistors.

The charge pump according to the present invention raises the precision of the ratio between the value of the current at the time of the UP operation and the value of the current output at the time of the DOWN operation and is capable of converting the result of the phase comparison to voltage correctly.

The reason for the above is as follows: In response to the active interval of the UP signal output from the phase comparator, a first charging current (P1) is supplied from a first transistor of a first conductivity type to a first loop filter which supplies terminal voltage to the non-inverting input terminal of a voltage-controlled oscillator, and a first discharge current (N1) is supplied from a first transistor of a second conductivity type to a second loop filter which supplies terminal voltage to the inverting input terminal of the voltage-control led oscillator. In response to the active interval of the DOWN signal output from the phase comparator, a second charging current (P2) is supplied from a second transistor of the first conductivity type to the second loop filter, and a second discharge current (N2) is supplied from a second transistor of the second conductivity type to the second loop filter. The ratio of a sum current (P1+N1) obtained by summing the first charging current (P1) and the first discharge current (N1) to a sum current (P2+N2) obtained by summing the second charging current (P2) and the second discharge current (N2) is capable of being set to 1:1 independently of a difference in output characteristics between the transistors of the first and second conductivity types and independently of differences in manufacture.

In accordance with the present invention, it is unnecessary to provide a correction circuit which corrects for differences in output characteristics and differences in manufacture of the P- and N-channel MOS transistors the element structures of which are different, and it is unnecessary to provide a step in which an adjustment is applied after manufacture. This makes it possible to lower cost and to achieve highly precise phase synchronization.

In accordance with the present invention, as long as the temperature characteristics or the power-supply voltage characteristics of transistors of identical conductivity type in the current output stage of a charge pump are the same, the temperature or power-supply-voltage dependence of the characteristic of a PLL circuit can be reduced even if the characteristics of transistors of first and second conductivity types, the element structures of which differ, in the current output stage of the charge pump do not agree. In other words, according to the present invention, it is no longer necessary to take transistor size and process transistor of manufacture, etc., into consideration for the purpose of matching the characteristics of the transistors of the first and second conductivity types in the current output stage of the charge pump. This shortens the time needed to design the PLL circuit. In addition, since the transistors of the first and second conductivity types can be designed independently of each other, there is greater degree of freedom in terms of design.

Furthermore, by applying the PLL circuit of the present invention to a data read-out apparatus, greater resistance to jitter is achieved and data can be read out more accurately.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A PLL circuit comprising:
(a) a phase comparator detecting a phase difference
(b) a charge pump converting the phase difference into a voltage
(c) a loop filter smoothing the voltage,
(d) a voltage-controlled oscillator receiving the smoothed voltage as a control voltage, and
wherein said phase comparator compares phase of an output signal from said voltage-controlled oscillator, or phase of an output signal obtained by frequency-dividing the output of said voltage-controlled oscillator by a frequency divider to an input signal;
wherein an output signal from said voltage-controlled oscillator, or frequency-divided output signal of the frequency divider, is fed back and input to said phase comparator to have its phase compared with that of said input signal;
wherein said voltage-controlled oscillator has a non-inverting input terminal and an inverting input terminal, and a difference voltage between terminal voltages impressed upon respective ones of said non-inverting and inverting input terminals is input to said voltage-controlled oscillator as a control voltage so that said voltage-controlled oscillator will oscillate at a frequency in accordance with this control voltage; and
wherein said charge pump controls enlarging or reducing the difference voltage between both variable terminal voltages of non-inverting and inverting input terminals of said voltage-controlled oscillator in accordance with an output from said phase comparator representing the result of the phase comparison, said PLL circuit further comprising first and second loop filters connected at output terminals thereof to the non-inverting and inverting input terminals, respectively, of said voltage-controlled oscillator;
wherein said charge pump performs the following control that (i) in accordance with an output from said phase comparator representing the result of the phase comparison, a first capacitor a terminal voltage whereof provides an output terminal voltage of said first loop filter is charged to thereby raise the terminal voltage of the non-inverting input terminal of said voltage-controlled oscillator, and a second capacitor a terminal voltage whereof provides an output terminal voltage of said second loop filter is discharged to thereby lower the terminal voltage of the inverting input terminal of said voltage-controlled oscillator, whereby the difference voltage is enlarged at the time of an operation for raising the oscillation frequency of said voltage-controlled oscillator; and
in accordance with the output from said phase comparator representing the result of the phase comparison, said first capacitor is discharged to thereby lower the terminal voltage of the non-inverting input terminal of said voltage-controlled oscillator, and said second capacitor is charged to thereby raise the terminal voltage of the inverting input terminal of said voltage-controlled oscillator, whereby said difference voltage is reduced at the time of an operation to lower the oscillation frequency of said voltage-controlled oscillator.

2. The PLL circuit according to claim 1, wherein said charge pump controls
(i) enlarging the difference voltage by raising the terminal voltage of the non-inverting input terminal and lowering the terminal voltage of the inverting input terminal of said voltage-controlled oscillator in accordance with the output from said phase comparator, or (ii) reducing the difference voltage by lowering the terminal voltage of the non-inverting input terminal and raising the terminal voltage of the inverting input terminal of said voltage-controlled oscillator in accordance with the output from said phase comparator.

3. The PLL circuit according to claim 1, wherein said charge pump increases the terminal voltage at the output terminal of said first loop filter by charging said first capacitor by an output current from a transistor of a first conductivity type and decreases the terminal voltage at the output terminal of said second loop filter by discharging said second capacitor by an output current from a transistor of a second conductivity type that is opposite the first conductivity type; and said charge pump increases the terminal voltage at the output terminal of said second loop filter by charging said second capacitor by an output current from a transistor of the first conductivity type and decreases the terminal voltage at the output terminal of said first loop filter by discharging said first capacitor by an output current from a transistor of the second conductivity type.

4. The PLL circuit according to claim 1, wherein said loop filter comprises first and second loop filters connected at output terminals thereof to the non-inverting and inverting input terminals, respectively, of said voltage-controlled oscillator; and said charge pump includes a first circuit and a second circuit wherein said first circuit, when a signal output from said phase comparator for raising the oscillation frequency of said voltage-controlled oscillator is in an active state, charging a first capacitor, that applies the terminal voltage of the output terminal of said first loop filter, by a constant current from a first constant-current source, thereby increasing the terminal voltage at the output terminal of said first loop filter, and discharging a second capacitor, that applies the terminal voltage of the output terminal of said second loop filter, by a constant current from a second constant-current source, thereby decreasing the terminal voltage at the output terminal of said second loop filter, whereby the difference voltage across the inverting and non-inverting input terminals of said voltage-controlled oscillator is enlarged; and said second circuit, when a signal output from said phase comparator for lowering the oscillation frequency of said voltage-controlled oscillator is in an active state, discharging said first capacitor, that applies the terminal voltage of the output terminal of said first loop filter, by a constant current from a third constant-current source, thereby decreasing the terminal voltage at the output terminal of said first loop filter, and charging said second capacitor, that applies the terminal voltage of the output terminal of said second loop filter, by a constant current from a fourth constant-current source, thereby increasing the terminal voltage at the output terminal of said second loop filter, whereby the difference voltage across the inverting and non-inverting input terminals of said voltage-controlled oscillator is reduced.

5. The PLL circuit according to claim 1, wherein the loop filter comprises first and second loop filters connected at output terminals thereof to the non-inverting and inverting input terminals, respectively, of said voltage-controlled oscillator; and said charge pump comprises a first circuit and a second circuit wherein said first circuit, in response to receipt of a first control signal output as a result of the phase comparison by said phase comparator, supplying a first charging current (P1) from first transistor of a first conductivity type to a capacitor of said first loop filter that supplies the terminal voltage to the non-inverting input terminal of said voltage-controlled oscillator, and a first discharge current (N1) from a first transistor of a second conductivity type to a capacitor of said second loop filter that supplies the terminal voltage to the inverting input terminal of said voltage-controlled oscillator; and said second circuit, in response to receipt of a second control signal output as a result of the phase comparison by said phase comparator, supplying a second charging current (P2) from a second transistor of the first conductivity type to the capacitor of said second loop filter that supplies the terminal voltage to the inverting input terminal of said voltage-controlled oscillator, and a second discharge current (N2) from a second transistor of the second conductivity type to the capacitor of said first loop filter that supplies the terminal voltage to the non-inverting input terminal of said voltage-controlled oscillator;

whereby a ratio of a sum current (P1+N1) obtained by summing the first charging current (P1) and the first discharge current (N1) to a sum current (P2+N2) obtained by summing the second charging current (P2) and the second discharge current (N2) is capable of being set to 1:1 independently of a difference in output characteristics between the transistors of the first conductivity type and the transistors of the second conductivity type.

6. The PLL circuit according to claim 1, wherein said voltage-controlled oscillator includes:

a voltage/current conversion circuit, to which the terminal voltage of said non-inverting input terminal and the terminal voltage of said inverting input terminal are input as a differential voltage, outputting a current that corresponds to the differential input voltage; and a current-controlled oscillator, to which the output current of said voltage/current conversion circuit is input as a control current, oscillating at a frequency conforming to this control current.

7. The PLL circuit according to claim 1, wherein the phase comparator outputs an UP signal for raising the frequency of said voltage-controlled oscillator and a DOWN signal for lowering the frequency of said voltage-controlled oscillator; and wherein said charge pump charges and discharges capacitors based upon UP and DOWN signals from said phase comparator and outputs a voltage conforming to result of the phase comparison by said phase comparator;

wherein said charge pump includes:

(b1) a first switch having a control terminal connected to the UP signal output from said phase comparator;

(b2) a first constant-current source connected between one end of said first switch and a high-potential power supply;

(b3) a first capacitor having one end connected to the other end of said first switch and to the non-inverting input terminal of said voltage-controlled oscillator and having its other end connected to a low-potential power supply;

(b4) a second switch having a control terminal connected to the UP signal output from said phase comparator;

(b5) a second constant-current source connected between one end of said second switch and the low-potential power supply;

(b6) a second capacitor having one end connected to the other end of said second switch and to the inverting input terminal of said voltage-controlled oscillator and having its other end connected to the low-potential power supply;

(b7) a third switch having a control terminal to the DOWN signal output from said phase comparator;

(b8) a third constant-current source connected the high-potential power supply and one end of said third switch;

(b9) a fourth switch having a control terminal connected to the DOWN signal output from said phase comparator; and (b10) a fourth constant-current source connected between the low-potential power supply and one end of said fourth switch;

(b11) wherein the other end of said third switch is to one end of said second capacitor;

(b12) the other end of said fourth switch is connected to one end of said first capacitor; wherein:

when the UP signal output from said phase comparator is in the active state, said first switch having the UP signal applied to its control terminal turns on and charges said first capacitor by a constant current from said first constant-current source to increase the terminal voltage of said first capacitor, and said second switch having the UP signal applied to its control terminal turns on to discharge said second capacitor by a constant current from said second constant-current source to decrease the terminal voltage of said second capacitor, thereby enlarging the difference voltage across the non-inverting input terminal and inverting input terminal of said voltage-controlled oscillator, whereby the oscillation frequency of said voltage-controlled oscillator rises; and when the DOWN signal output from said phase comparator is in the active state, said third switch having the DOWN signal applied to its control terminal turns on and charges said second capacitor by a constant current from said third constant-current source to increase the terminal voltage of said second capacitor, and said fourth switch having the DOWN signal applied to its control terminal turns on to discharge said first capacitor by a constant current from said fourth constant-current source to decrease the terminal voltage of said first capacitor, thereby reducing the difference voltage across the non-inverting input terminal and inverting input terminal of said voltage-controlled oscillator, whereby the oscillation frequency of said voltage-controlled oscillator falls.

8. The PLL circuit according to claim 1, wherein the charge pump charges and discharges a capacitor in accordance with result of a phase comparison based upon an UP signal and a DOWN signal output from a phase comparator, the loop filters smooth an output voltage of said charge pump, and the voltage-controlled oscillator to which an output voltage of said loop filter is input as a control voltage, an output voltage of said voltage-controlled oscillator is fed back and input to said phase comparator;

and wherein (e) an output terminal of a first loop filter and an output terminal of a second loop filter are connected to non-inverting and inverting input terminals, respectively, of said voltage-controlled oscillator;

(f) said voltage-controlled oscillator has a difference voltage between terminal voltages of the non-inverting and inverting input terminals input thereto as a control voltage and oscillates at a frequency conforming to this control voltage;

(g) said charge pump has first to fourth constant-current sources and first to fourth current mirror circuits;

(h) when the UP signal output from said phase comparator is in the active state, (h1) a constant current from said first constant-current source is reflected by said first current mirror circuit so that a first charging current is supplied from a transistor of a first conductivity type, which forms the output terminal of said first current mirror circuit, to a capacitor of said first loop filter that supplies the terminal voltage to the non-inverting input terminal of said voltage-controlled oscillator, and (h2) a constant current from said second constant-current is reflected by said second current mirror circuit so that a first discharge current is supplied from a transistor of a second conductivity type, which forms the output terminal of said second current mirror circuit, to a capacitor of said second loop filter that supplies the terminal voltage to the inverting input terminal of said voltage-controlled oscillator; and (i) when the DOWN signal output from said phase comparator is in the active state, (i1) a constant current from said third constant-current source is reflected by said third current mirror circuit so that a second charging current is supplied from a transistor of the first conductivity type, which forms the output terminal of said third current mirror circuit, to the capacitor of said second loop filter that supplies the terminal voltage to the non-inverting input terminal of said voltage-controlled oscillator, and (i2) a constant current from said fourth constant-current source is reflected by said fourth current mirror circuit so that a second discharge current is supplied from a transistor of the second conductivity type, which forms the output terminal of said fourth current mirror circuit, to the capacitor of said first loop filter that supplies the terminal voltage to the inverting input terminal of said voltage-controlled oscillator;

(j) whereby a ratio of a sum current obtained by summing the first charging current and the first discharge current to a sum current obtained by summing the second charging current and the second discharge current is capable of being set to 1:1 independently of a difference in output characteristics between the transistors of the first conductivity type and the transistors of the second conductivity type.

9. The PLL circuit according to claim 8, wherein the transistors of the first conductivity type constituting said first and third current mirror circuits comprise P-channel MOS transistors, and the transistors of the second conductivity type constituting said second and fourth current mirror circuits comprise N-channel MOS transistors.

10. The PLL circuit according to claim 1, wherein
the charge pump charges and discharges a capacitor in accordance with result of a phase comparison based upon an UP signal and a DOWN signal output from a phase comparator,
the loop filters smooth output voltages of said charge pump and
the voltage-controlled oscillator to which output voltages of said loop filters are input as control voltages, and
an output signal of said voltage-controlled oscillator is fed back and input to said phase comparator directly, or a signal obtained by frequency-dividing the output signal of said voltage-controlled oscillator at a predetermined frequency dividing ratio being fed back and input to said comparator;
wherein
first and second loop filters are connected at output terminals thereof to non-inverting and inverting input terminals, respectively, of said voltage-controlled oscillator are provided;
said voltage-controlled oscillator has a difference voltage between terminal voltages of said non-inverting and inverting input terminals input thereto as the control voltage for oscillating at a frequency in accordance with this control voltage; and
said charge pump includes:
a first current mirror circuit comprising first and second transistors of a first conductivity type;
a first switch activating said first current mirror circuit when an UP signal output from said phase comparator is in the active state;
a first constant-current source connected between an input terminal of said first current mirror circuit and the low-potential power supply;
a second current mirror circuit comprising first and second transistors of a second conductivity type that is opposite the first conductivity type;
a second switch activating said second current mirror circuit when the UP signal output from said phase comparator is in the active state;
a second constant-current source connected between an input terminal of said second current mirror circuit and a high-potential power supply;
a third current mirror circuit comprising third and fourth transistors of the first conductivity type;
a third switch activating said third current mirror circuit when the DOWN signal output from said phase comparator is in the active state;
a third constant-current source connected between an input terminal of said third current mirror circuit and the low-potential power supply;
a fourth current mirror circuit comprising third and fourth transistors of the second conductivity type;
a fourth switch activating said fourth current mirror circuit when the DOWN signal output from said phase comparator is in the active state; and
a fourth constant-current source connected between an input terminal of said fourth current mirror circuit and the high-potential power supply; wherein
the output terminal of said first current mirror circuit and the output terminal of said fourth current mirror circuit is connected in common with one end of a first capacitor a terminal voltage whereof provides an output terminal voltage of said first loop filter; and
the output terminal of said second current mirror circuit and the output terminal of said third current mirror circuit is connected in common with one end of a second capacitor a terminal voltage whereof provides an output terminal voltage of said second loop filter.

11. The PLL circuit according to claim 10, wherein the transistors of the first conductivity type constituting said first and third current mirror circuits comprise P-channel MOS transistors, and the transistors of these second conductivity type constituting said second and fourth current mirror circuits comprise N-channel MOS transistors.

12. The PLL circuit according to claim 10, wherein:
said first switch comprises a P-channel MOS transistor having a source connected to the high-potential power supply, a drain connected to a common gate of a P-channel MOS transistor constituting said first current mirror circuit, and a gate connected to the UP signal from said phase comparator;
said second switch comprises an N-channel MOS transistor having a source connected to the low-potential power supply, a drain connected to a common gate of an N-channel MOS transistor constituting said second current mirror circuit, and a gate connected to a signal obtained by inverting the UP signal from said phase comparator;
said third switch comprises a P-channel MOS transistor having a source connected to the high-potential power supply, a drain connected to a common gate of a P-channel MOS transistor constituting said third current mirror circuit, and a gate connected to the DOWN signal from said phase comparator; and
said fourth switch comprises an N-channel MOS transistor having a source connected to the low-potential power supply, a drain connected to a common gate of an N-channel MOS transistor constituting said fourth current mirror circuit, and a gate connected to a signal obtained by inverting the DOWN signal from said phase comparator.

13. The PPL circuit according to claim 1, wherein the charge pump comprises:
(a) a first switch having a control terminal connected to a first control signal;
(b) a first constant-current source connected between a high-potential power supply and one end of said first switch;
(c) a first capacitor having one end connected to the other end of said first switch and having its other end connected to a low-potential power supply;
(d) a second switch having a control terminal connected to the first control signal;
(e) a second constant-current source connected between the low-potential power supply and one end of said second switch;
(f) a second capacitor having one end connected to the other end of said second switch and having its other end connected to the low-potential power supply;
(g) a third switch having a control terminal connected to a second control signal;
(h) a third constant-current source connected between the high-potential power supply and one end of said third switch;
(i) a fourth switch having a control terminal connected to the second control signal; and
(j) a fourth constant-current source connected between the low-potential power supply and one end of said fourth switch;
wherein
(k) the other end of said third switch is connected to one end of said second capacitor;

(l) the other end of said fourth switch is connected to one end of said first capacitor;

(m) when the first control signal is in the active state, said first switch turns on and supplies a constant current from said first constant-current source to said first capacitor to charge the same and said second switch also turns on to discharge said second capacitor by a constant current from said second constant-current source, thereby enlarging a difference voltage between the terminal voltage of said first capacitor and the terminal voltage of said second capacitor;

(n) when the second control signal is in the active state, said third switch turns on and supplies a constant current from said third constant-current source to said second capacitor to charge the same, and said fourth switch also turns on to discharge said first capacitor by a constant current from said fourth constant-current source, thereby reducing the difference voltage between the terminal voltage of said first capacitor and the terminal voltage of said second capacitor; and (o) the terminal voltage of said first capacitor is delivered as a non-inverted output, and the terminal voltage of said second capacitor is delivered as an inverted output.

14. The PPL circuit according to claim 1, wherein the charge pump comprises:

(a) a first current mirror circuit comprising first and second transistors of a first conductivity type;

(b) a first switch having a control terminal to which a first control signal is input to activate said first current mirror circuit when an inverted signal of the first control signal is in the active state;

(c) a first constant-current source connected between an input terminal of said first current mirror circuit and a low-potential power supply;

(d) a second current mirror circuit comprising first and second transistors of a second conductivity type that is opposite the first conductivity type;

(e) a second switch having a control terminal to which the first control signal is input to activate said second current mirror circuit when the first control signal is in the active state;

(f) a second constant-current source connected between an input terminal of said second current mirror circuit and a high-potential power supply;

(g) a third current mirror circuit comprising third and fourth transistors of the first conductivity type;

(h) a third switch having a control terminal to which the second control signal is input to activate said third current mirror circuit when an inverted signal of the second control signal is in the active state;

(i) a third constant-current source connected between an input terminal of said third current mirror circuit and the low-potential power supply;

(j) a fourth current mirror circuit comprising third and fourth transistors of the second conductivity type;

(k) a fourth switch having a control terminal to which the second control signal is input to activate said second current mirror circuit when the second control signal is in the active state; and (l) a fourth constant-current source connected between an input terminal of said fourth current mirror circuit and the high-potential power supply wherein (m) the output terminal of said first current mirror circuit and the output terminal of said fourth current mirror circuit are connected in common with one end of a first capacitor the other of which is connected to the low-potential power supply;

(n) the output terminal of said second current mirror circuit and the output terminal of said third current mirror circuit are connected in common with one end of a second capacitor the other end of which is connected the low-potential power supply; and (o) a terminal voltage of said first capacitor is delivered as a non-inverted output and a terminal voltage of said second capacitor is delivered as an inverted output.

15. The PPL circuit according to claim 1, wherein the voltage-controlled oscillator has a voltage/current conversion circuit for converting an input voltage to a current, and a current-controlled oscillator, to which an output current from said voltage/current conversion circuit is input as a control current, for oscillating at a frequency in accordance with the control current, wherein said voltage/current conversion circuit has a non-inverting input terminal and an inverting input terminal and outputs a current corresponding to a difference voltage between first and second input voltages of variable voltage values applied to said non-inverting input terminal and said inverting input terminal, respectively.

16. The PLL circuit according to claim 1, further comprising:

(a) a current-controlled oscillator generating and outputting a clock signal having a frequency conforming to an entered control current;

(b) a frequency divider frequency-dividing the clock signal from said current-controlled oscillator;

(c) a phase comparator, to which an input signal and the clock signal that is output from said frequency divider are input, outputting an UP signal and a DOWN signal in conformity with phase lag and lead of the clock signal relative to the input signal;

(d) a first charge pump for producing an output voltage by charging and discharging a capacitor based upon the UP and DOWN signals output from said phase comparator;

(e) a frequency comparator, to which the input signal and the clock signal that is output from said frequency divider are input, detecting a frequency error by measuring a synchronization pattern of the input signal using the clock signal output from said frequency divider;

(f) a second charge pump outputting an error voltage that conforms to the frequency error;

(g) a first low-pass filter to which the output voltage of said first charge pump is input;

(h) a second low-pass filter to which the output voltage of said second charge pump is input;

(i) a first voltage/current conversion circuit converting the output voltage of said first low-pass filter to current; and (j) a second voltage/current conversion circuit converting the output voltage of said second low-pass filter to current;

wherein (k) a sum current obtained by summing a current from said first voltage/current conversion circuit and a current from said second voltage/current conversion circuit is input to said current-controlled oscillator as the control current;

(l) said voltage/current conversion circuit has a non-inverting input terminal and an inverting input terminal and outputs a current in accordance with a difference voltage between terminal voltages of said non-inverting and inverting input terminals;

(m) said first low-pass filter comprises a first loop filter and a second loop filter connected at output terminals thereof to the non-inverting and inverting input terminals of said first voltage/current conversion circuit, respectively;

(n) said first charge pump has a control unit enlarging and/or reducing a difference voltage between the terminal voltages of the non-inverting and inverting input terminals of said first voltage/current conversion circuit in which, when the UP signal is being output from said phase comparator, the control unit charges a first capacitor a terminal voltage whereof provides an output terminal voltage of said first loop filter to thereby raise the terminal voltage of the non-inverting input terminal of said first voltage/current conversion circuit and discharges a second capacitor a terminal voltage whereof provides an output terminal voltage of said second loop filter to thereby lower the terminal voltage of the inverting input terminal of said first voltage/current conversion circuit whereby the difference voltage is enlarged;

and in which, when the DOWN signal is being output from said phase comparator, the control unit discharges said first capacitor the terminal voltage whereof provides an output terminal voltage of said first loop filter to thereby lower the terminal voltage of the non-inverting input terminal of said first voltage/current conversion circuit, and charges said second capacitor the terminal voltage whereof provides an output terminal voltage of said second loop filter to thereby raise the terminal voltage of the inverting input terminal of said first voltage/current conversion circuit whereby the difference voltage is reduced.

17. The PLL circuit according to claim 1, further comprising:

(a) a current-controlled oscillator generating and outputting a clock signal having a frequency conforming to an entered control current;

(b) a frequency divider frequency-dividing the clock signal from said current-controlled oscillator;

(c) a phase comparator, to which an input signal and the clock signal that is output from said frequency divider are input, outputting an UP signal and a DOWN signal in conformity with phase lag and lead of the clock signal relative to the input signal;

(d) a first charge pump producing an output voltage by charging and discharging a capacitor based upon the UP and DOWN signals output from said phase comparator;

(e) a frequency comparator, to which the input signal and the clock signal that is output from said frequency divider are input, detecting a frequency error by measuring a synchronization pattern of the input signal using the clock signal output from said frequency divider;

(f) a second charge pump outputting an error voltage that conforms to the frequency error;

(g) a first low-pass filter to which the output voltage of said first charge pump is input;

(h) a second low-pass filter to which the output voltage of said second charge pump is input;

(i) a first voltage/current conversion circuit converting the output voltage of said first low-pass filter to current; and (j) a second voltage/current conversion circuit converting the output voltage of said second low-pass filter to current;

wherein (k) a sum current obtained by summing a current from said first voltage/current conversion circuit and a current from said second voltage/current conversion circuit is input to said voltage-controlled oscillator as the control current;

(l) said first voltage/current conversion circuit has a non-inverting input terminal and an inverting input terminal and outputs a current in accordance with a difference voltage between terminal voltages of said non-inverting and inverting input terminals;

(m) said first low-pass filter comprises a first loop filter and a second loop filter connected at output terminals thereof to the non-inverting and inverting input terminals of said first voltage/current conversion circuit, respectively;

(n) said first charge pump has first to fourth constant-current sources and first to fourth current mirror circuits; and (o) wherein when the UP signal output from said phase comparator is in the active state, a constant current from said first constant-current source is reflected by said first current mirror circuit so that a first charging current is supplied from a transistor of a first conductivity type, which forms the output terminal of said first current mirror circuit, to a capacitor of said first loop filter that supplies the terminal voltage to the non-inverting input terminal of said first voltage-controlled oscillator, and a constant current from said second constant-current source is reflected by said second current mirror circuit so that a first discharge current is supplied from a transistor of a second conductivity type, which forms the output terminal of said second current mirror circuit, to a capacitor of said second loop filter that supplies the terminal voltage to the inverting input terminal of said first voltage-controlled oscillator; and (p) when the DOWN signal output from said phase comparator is in the active state, a constant current from said third constant-current source is reflected by said third current mirror circuit so that a second charging current is supplied from a transistor of the first conductivity type, which forms the output terminal of said third current mirror circuit, to the capacitor of said second loop filter that supplies the terminal voltage to the non-inverting input terminal of said first voltage-controlled oscillator, and a constant current from said fourth constant-current source is reflected by said fourth current mirror circuit so that a second discharge current is supplied from a transistor of the second conductivity type, which forms the output terminal of said fourth current mirror circuit, to the capacitor of said first loop filter that supplies the terminal voltage to the inverting input terminal of said first voltage-controlled oscillator;

(q) whereby a ratio of a sum current obtained by summing the first charging current and the first discharge current to a sum current obtained by summing the second charging current and the second discharge current is capable of being set to 1:1 independently of a difference in output characteristics between the transistors of the first conductivity type and the transistors of the second conductivity type.

18. The PLL circuit according to claim 1, further comprising:
(a) a current-controlled oscillator generating and outputting a clock signal having a frequency conforming to an entered control current;
(b) a frequency divider frequency-dividing the clock signal from said current-controlled oscillator;
(c) a phase comparator, to which an input signal and the clock signal that is output from said frequency divider are input, outputting an UP signal and a DOWN signal in conformity with phase lag and lead of the clock signal relative to the input signal;
(d) first charge pump producing an output voltage by charging and discharging a capacitor based upon the UP and DOWN signals output from said phase comparator;
(e) a frequency comparator, to which the input signal and the clock signal that is output from said frequency divider are input, detecting a frequency error by measuring a synchronization pattern of the input signal using the clock signal output from said frequency divider;
(f) a second charge pump outputting an error voltage that conforms to the frequency error;
(g) a first low-pass filter to which the output voltage of said first charge pump is input;
(h) a second low-pass filter to which the output voltage of said second charge pump is input;
(i) a first voltage/current conversion circuit converting the output voltage of said first low-pass filter to current; and
(j) a second voltage/current conversion circuit converting the output voltage of said second low-pass filter to current;
wherein
(k) a sum current obtained by summing a current from said first voltage/current conversion circuit and a current from said second voltage/current conversion circuit is input to said voltage-controlled oscillator as the control current;
(l) said voltage/current conversion circuit has a non-inverting input terminal and an inverting input terminal and outputs a current in accordance with a difference voltage between terminal voltages of said non-inverting and inverting input terminals;
(m) said first low-pass filter comprises by a first loop filter and a second loop filter connected at output terminals thereof to the non-inverting and inverting input terminals of said first voltage/current conversion circuit, respectively;
(n) wherein said first charge pump includes:
(n1) a first current mirror circuit comprising first and second transistors of a first conductivity type;
(n2) a first switch activating said first current mirror circuit when an UP signal output from said phase comparator is in the active state;
(n3) a first constant-current source connected between an input terminal of said first current mirror circuit and the low-potential power supply;
(n4) a second current mirror circuit comprising first and second transistors of a second conductivity type that is opposite the first conductivity type;
(n5) a second switch activating said second current mirror circuit when the UP signal output from said phase comparator is in the active state;
(n6) a second constant-current source connected between an input terminal of said second current mirror circuit and a high-potential power supply;
(n7) a third current mirror circuit comprising third and fourth transistors of the first conductivity type;
(n8) a third switch activating said third current mirror circuit when the DOWN signal output from said phase comparator is in the active state;
(n9) a third constant-current source connected between an input terminal of said third current mirror circuit and the low-potential power supply;
(n10) a fourth current mirror circuit comprising third and fourth transistors of the second conductivity type;
(n11) a fourth switch activating said fourth current mirror circuit when the DOWN signal output from said phase comparator is in the active state; and
(n12) a fourth constant-current source connected between an input terminal of said fourth current mirror circuit and the high-potential power supply;
(o) wherein the output terminal of said first current mirror circuit and the output terminal of said fourth current mirror circuit being connected in common with one end of a first capacitor a terminal voltage whereof provides an output terminal voltage of said first loop filter; and
(p) wherein the output terminal of said second current mirror circuit and the output terminal of said third current mirror circuit being connected in common with one end of a second capacitor a terminal voltage whereof provides an output terminal voltage of said first loop filter.

19. A data read-out apparatus comprising:
(a) an amplifier for generating a playback RF signal from data read via a head for reading data from a recording disk;
(b) a filter for eliminating noise from and wave-form equalizing the playback RF signal from said amplifier;
(c) a binarizing circuit for binarizing the playback RF from said filter;
(d) a PLL circuit as claimed in claim 16, to which data binarized by said binarizing circuit is input, generating and outputting a read clock synchronized to this binarized data;
(e) a demodulation circuit for demodulating data based upon the data read clock from said PLL circuit; and
(f) a CPU performing overall control of the apparatus.

20. A data read-out apparatus comprising:
(a) an amplifier for generating a playback RF signal from data read via a head for reading data from a recording disk;
(b) a filter for eliminating noise from and wave-form equalizing the playback RF signal from said amplifier;
(c) a binarizing circuit for binarizing the playback RF from said filter;
(d) a PLL circuit as claimed in claim 17, to which data binarized by said binarizing circuit is input, generating and outputting a read clock synchronized to this binarized data; and
(e) a demodulation circuit for demodulating data based upon the data read clock from said PLL circuit.

21. A data read-out apparatus comprising:
(a) an amplifier for generating a playback RF signal from data read via a head for reading data from a recording disk;
(b) a filter for eliminating noise from and wave-form equalizing the playback RE signal from said amplifier;
(c) a binarizing circuit for binarizing the playback RF from said filter;
(d) a PLL circuit as claimed in claim 18, to which data binarized by said binarizing circuit is input, generating and outputting a read clock synchronized to this binarized data; and
(e) a demodulation circuit for demodulating data based upon the data read clock from said PLL circuit.

* * * * *